United States Patent
Guler et al.

(10) Patent No.: US 12,484,281 B2
(45) Date of Patent: Nov. 25, 2025

(54) TOPSIDE PLUGS FOR EPITAXIAL CONTACT FORMATION

(71) Applicant: Intel Corporation, Santa Clara, CA (US)

(72) Inventors: Leonard P. Guler, Hillsboro, OR (US); Nikhil J. Mehta, Portland, OR (US); Krishna Ganesan, Portland, OR (US); Chanaka D. Munasinghe, Portland, OR (US); Tahir Ghani, Portland, OR (US); Charles H. Wallace, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 755 days.

(21) Appl. No.: 17/687,032

(22) Filed: Mar. 4, 2022

(65) Prior Publication Data

US 2023/0282717 A1 Sep. 7, 2023

(51) Int. Cl.
*H10D 64/23* (2025.01)
*H10D 30/67* (2025.01)
*H10D 84/01* (2025.01)
*H10D 84/83* (2025.01)

(52) U.S. Cl.
CPC ....... *H10D 64/258* (2025.01); *H10D 30/6735* (2025.01); *H10D 84/0149* (2025.01); *H10D 84/83* (2025.01)

(58) Field of Classification Search
CPC ............. H10D 64/258; H10D 30/6735; H10D 84/0149; H10D 84/83; H10D 30/6757; H10D 84/013
See application file for complete search history.

(56) References Cited

U.S. PATENT DOCUMENTS

| | | | |
|---|---|---|---|
| 2017/0194143 A1* | 7/2017 | Balakrishnan | H10D 84/0128 |
| 2018/0108526 A1* | 4/2018 | Mitard | H10D 30/43 |
| 2021/0336020 A1* | 10/2021 | Yu | H01L 21/76897 |
| 2023/0170386 A1* | 6/2023 | Lee | H10D 30/43 |

* cited by examiner

*Primary Examiner* — Changhyun Yi
(74) *Attorney, Agent, or Firm* — Finch & Maloney PLLC

(57) ABSTRACT

Techniques are provided herein to form semiconductor devices that use uniform topside dielectric plugs as masking structures to form conductive contacts to various source or drain regions. In an example, a plurality of semiconductor devices each include one or more semiconductor regions extending in a first direction between corresponding source or drain regions. The source or drain regions are adjacent to one another along a second direction different from the first direction. Conductive contacts are formed over the source or drain regions of the semiconductor devices. A dielectric fill is between one or more adjacent pairs of conductive contacts and dielectric masking structures having a substantially uniform thickness are present over the dielectric fill between adjacent pairs of conductive contacts. This uniform thickness characteristic applies to all of the masking structures regardless of their length along the second direction.

20 Claims, 15 Drawing Sheets

TOPSIDE PLUGS FOR EPITAXIAL CONTACT FORMATION

FIELD OF THE DISCLOSURE

The present disclosure relates to integrated circuits, and more particularly, to the epitaxial region contact formation for transistor devices.

BACKGROUND

As integrated circuits continue to scale downward in size, a number of challenges arise. For instance, reducing the size of memory and logic cells is becoming increasingly more difficult. Providing contacts to the various transistor structures presents a challenge as the devices continue to scale downward. The various fabrication operations can become difficult when dealing with semiconductor devices having varying distances from one another, as loading effects during certain etching processes can cause inconsistencies with some of the etched depths. As a result, contacts in the source and drain regions may exhibit different profiles across the chip. Accordingly, there remain a number of non-trivial challenges with respect to semiconductor source and drain contact formation.

Figure 1A:
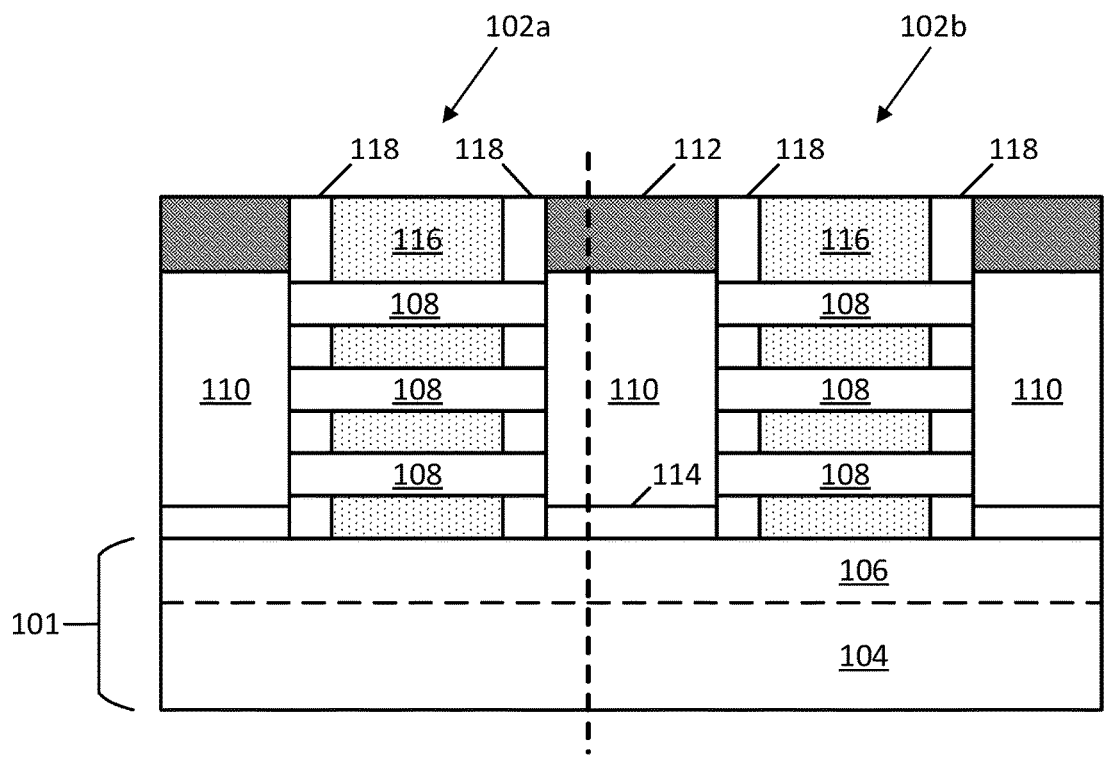
FIGS. 1A and 1B are cross-sectional views of an integrated circuit configured with topside dielectric plugs to aid in the formation of source and/or drain contacts, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form semiconductor devices that use topside dielectric plugs as masking structures to form uniform conductive contacts to various source and/or drain regions. The techniques can be used in any number of integrated circuit applications and are particularly useful with respect to logic and memory cells, such as those cells that use finFETs or gate-all-around transistors. In an example, a plurality of semiconductor devices each include one or more semiconductor regions extending in a first direction between corresponding source and drain regions. The source and/or drain regions of neighboring devices are adjacent to one another along a second direction different from the first direction. Conductive contacts are formed over some or all of the source and/or drain regions of the semiconductor devices. A dielectric fill is between one or more adjacent pairs of conductive contacts and a dielectric masking structure is present over the dielectric fill between the one or more adjacent pairs of conductive contacts. The dielectric masking structure has a different dielectric material compared to the dielectric fill (e.g., different with respect to etch rate for a given etch scheme). In an embodiment, each of the dielectric masking structures has a substantially same thickness (e.g., within 1 nm of each other). This thickness characteristic applies to all of the masking structures regardless of their length along the second direction, according to some such embodiments. Numerous variations and embodiments will be apparent in light of this disclosure.

General Overview

As previously noted above, there remain a number of non-trivial challenges with respect to epitaxial contact formation. Epitaxial contacts may be formed along the top surface of the source or drain regions for frontside contacts or formed on the bottom surface of the source or drain regions for backside contacts. Hard mask materials may be formed in order to selectively expose the dielectric material over the source or drain regions, such that the dielectric material can be subsequently removed over the source or drain regions. Contacts may then be formed within the resulting recesses over the source or drain regions. However, if the formation of the hard mask materials is not uniform across the integrated circuit, it can cause subsequent non-uniformity in the contact formation. Often, non-uniformity of various etching processes across a large surface (such as across a given integrated circuit) are caused due to loading effects where larger exposed surfaces etch faster than smaller exposed surfaces.

Thus, and in accordance with an embodiment of the present disclosure, techniques are provided herein to form more uniform epitaxial contact structures by first forming more uniform (e.g., substantially same thickness) masking structures to facilitate the contact structure formation. In some such embodiments, the topside contacts are formed such that they wrap around at least a portion of the corresponding source or drain regions, thus contacting portions of the sidewalls to provide an enhanced ohmic contact. The epitaxial source or drain region may also include a highly conductive outer layer, such as a silicide layer, to provide a better ohmic contact with the conductive material (e.g., a metal) of the contact. The masking structures may be formed within recesses made through a sacrificial material deposited over a dielectric fill present between source or drain regions. By using a sacrificial material to aid in the formation of the masking structures, they can be made more uniformly across a larger area, such as a portion of an integrated circuit or across an entire footprint of an integrated circuit. According to some such embodiments, the masking structures include a dielectric material that is different from the dielectric material of the underlying dielectric fill. Portions of the dielectric fill around the source or drain regions are removed between the masking structures in order to form the recesses for the contact structures.

According to an embodiment, an integrated circuit includes a plurality of semiconductor devices, each of the semiconductor devices having one or more semiconductor regions extending in a first direction between corresponding source and drain regions, such that the source and/or drain regions of neighboring devices are adjacent to one another along a second direction different from the first direction. The integrated circuit also includes a plurality of conductive contacts with each of the plurality of conductive contacts being over a corresponding source or drain region of the plurality of source or drain regions, a dielectric fill between each adjacent pair of source or drain regions in the second direction, and a plurality of masking structures. Each of the plurality of masking structures are between an adjacent pair of conductive contacts and over the dielectric fill and each of the plurality of masking structures has a substantially same thickness. The one or more semiconductor regions may include, for example, one or more nanoribbons, nanowires, or nanosheets, although fin structures can be used as well.

According to another embodiment, an integrated circuit includes a first semiconductor device having a first semiconductor body extending in a first direction from a first source or drain region, a second semiconductor device having a second semiconductor body extending in the first direction from a second source or drain region, and a third semiconductor device having a third semiconductor body extending in the first direction from a third source or drain region. The first, second, and third source or drain regions are adjacent to one another along a second direction different from the first direction. The integrated circuit also includes a dielectric fill between each adjacent pair of source or drain regions in the second direction, a first masking structure between the first source or drain region and the second source or drain region and over the dielectric fill, and a second masking structure between the second source or drain region and the third source or drain region and over the dielectric fill. The first masking structure has a first length in the second direction and the second masking structure has a second length in the second direction different from the first length. The first and second masking structures have a substantially same thickness (e.g., within 1 nm of each other). Each of the first, second, and third semiconductor bodies may include, for example, one or more nanoribbons, nanowires, or nanosheets.

According to another embodiment, a method of forming an integrated circuit includes forming a plurality of fins comprising semiconductor material, wherein the plurality of fins extend parallel to one another in a first direction; forming a plurality of source and drain regions at ends of the semiconductor material of adjacent fins, such that the plurality of source or drain regions are adjacent to one another along a second direction different from the first direction; forming a dielectric fill around and over the plurality of source or drain regions; recessing the dielectric fill, wherein the recessed dielectric fill does not expose a top surface of any of the plurality of source or drain regions; forming a sacrificial material within a recessed area above the dielectric fill; etching away portions of the sacrificial material between adjacent ones of the plurality of source or drain regions; forming masking structures within the etched-away portions of the sacrificial material; removing the sacrificial material; etching portions of the dielectric fill around the plurality of source or drain regions and between the masking structures; and forming conductive contacts on the plurality of source or drain regions and between the masking structures.

The techniques can be used with any type of non-planar transistors, including finFETs (sometimes called double-gate transistors, or tri-gate transistors), or nanowire, nanosheet, and nanoribbon transistors (sometimes called gate-all-around transistors), to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The source and drain regions may be any epitaxial diffusion region. The gate structure can be implemented with a gate-first process or a gate-last process (sometimes called a remove metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of masking structures (e.g., topside dielectric plugs between epitaxial contacts) formed over the dielectric fill between source or drain regions. The masking structures may have a substantially uniform thickness (e.g., within 1 nm of each other), regardless of the length of the masking structures between their corresponding adjacent pairs of source or drain regions. Numerous configurations and variations will be apparent in light of this disclosure.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Architecture

Figure 1B:
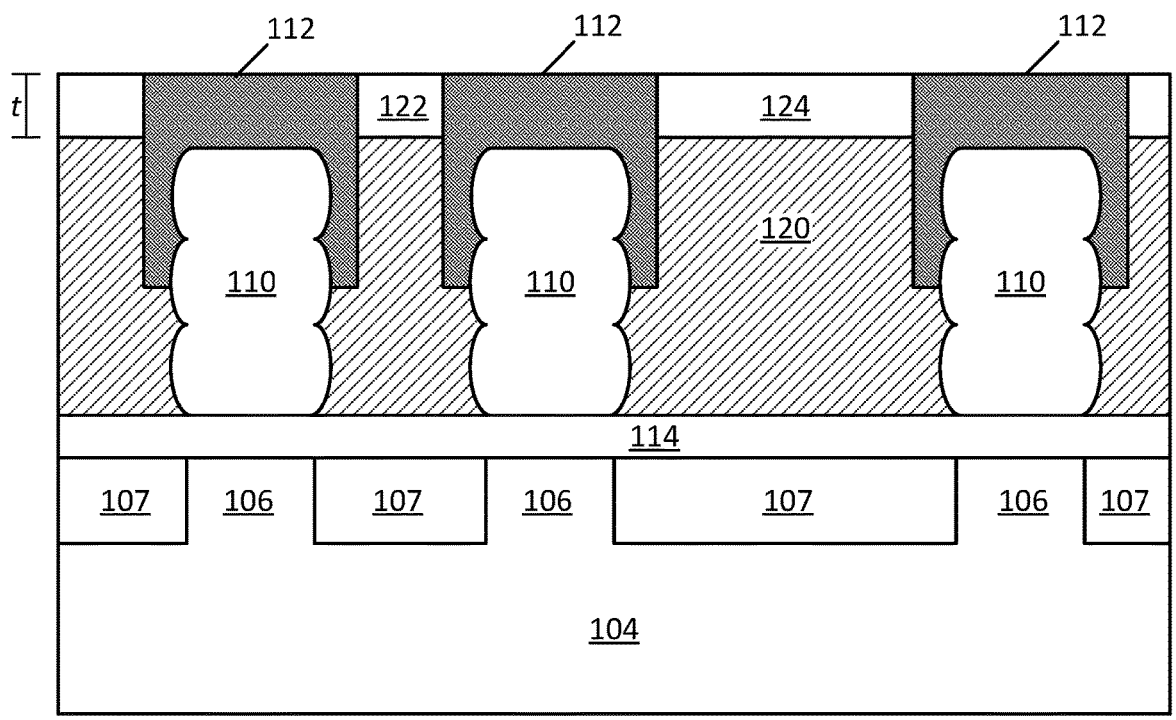

FIGS. 1A and 1B are cross-sectional views of a portion of an integrated circuit that includes various semiconductor devices, in accordance with an embodiment of the present disclosure. Two such semiconductor devices 102a and 102b are illustrated in FIG. 1A. The cross-section in FIG. 1B is taken across the vertical dashed line in FIG. 1A. Accordingly, the cross-section view in FIG. 1B illustrates the adjacent source or drain regions formed at the ends of each of the semiconductor devices. Each of the semiconductor devices may be non-planar metal oxide semiconductor (MOS) transistors, such as tri-gate or gate-all-around transistors, although other transistor topologies and types could also benefit from the techniques provided herein. The examples herein illustrate semiconductor devices with a GAA structure (e.g., having nanoribbons, nanowires, or nanosheets that extend between source and drain regions).

The semiconductor material used in each of the semiconductor devices may be formed from a semiconductor substrate 101. Substrate 101 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 101 can be a semiconductor-on-insulator substrate having a desired semiconductor layer over a buried insulator layer (e.g., silicon over silicon dioxide). Alternatively, substrate 101 can be a multilayer substrate or superlattice suitable for forming nanowires or nanoribbons (e.g., alternating layers of silicon and SiGe, or alternating layers indium gallium arsenide and indium phosphide). Any number of substrates can be used. Substrate 101 may include a bulk region 104 and any number of subfins 106 as seen more clearly in FIG. 1B. Each subfin 106 may be formed via etching through a portion of substrate 101 and are aligned beneath corresponding semiconductor devices.

As can further be seen, a dielectric layer 107 extends across a bottom portion of the integrated circuit and between subfins 106 of each of the semiconductor devices, according to an embodiment. Dielectric layer 107 may include any suitable dielectric material such as silicon oxide. Dielectric layer 107 provides shallow trench isolation (STI) between adjacent semiconductor devices. According to some embodiments, subfins 106 are portions of the semiconductor fins that remain after formation of the various transistors and may be formed from a semiconductor substrate that is later removed to form backside interconnect structures. Accordingly, subfins 106 may include the same semiconductor material as the one or more semiconductor regions of the semiconductor devices.

The one or more semiconductor regions of semiconductor devices 102a and 102b may include fins that can be, for example, native to the substrate (formed from the substrate itself), such as silicon fins etched from a bulk silicon substrate. Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In still other embodiments, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around process can then be carried out. Again, the alternating layers can be blanket deposited and then etched into fins or deposited into fin-shaped trenches.

In the illustrated example, semiconductor devices 102a and 102b include one or more nanoribbons 108 (e.g., semiconductor regions or bodies) extending between epitaxial source or drain regions 110 in a first direction. Source or drain regions 110 may be formed at the ends of nanoribbons 108 of each device, and thus may be aligned adjacent to one another along a second direction different from the first direction as seen in FIG. 1B. The second direction may be orthogonal to the first direction. According to some embodiments, source or drain regions 110 are epitaxial regions that are provided on the semiconductor regions in an etch-and-replace process. In other embodiments source or drain regions 110 could be, for example, implantation-doped native portions of the fins or substrate. Any semiconductor materials suitable for source or drain regions can be used (e.g., group IV and group III-V semiconductor materials). Source or drain regions 110 may include multiple layers such as liners and capping layers to improve contact resistance. In any such cases, the composition and doping of source or drain regions 110 may be the same or different, depending on the polarity of the transistors. Any number of source or drain configurations and materials can be used. In some embodiments, a conductive liner may be present along the outer surface of source or drain regions 110, such that the conductive liner is present between source or drain regions 110 and corresponding conductive contacts 112. The conductive liner may be a silicide or other highly conductive material, and may be used to further reduce the contact resistance between source or drain regions 110 and conductive contacts 112. In some embodiments, conductive contacts 112 each wrap around a portion of source or drain regions 110. Conductive contacts 112 may be any suitable conductive material such as tungsten. According to some embodiments, a bottom dielectric layer 114 may be provided to form an insulating buffer between source or drain regions 110 and subfins 106. Bottom dielectric layer 114 may be any suitable dielectric material, such as silicon oxide, silicon nitride, or silicon oxynitride.

According to some embodiments, semiconductor devices 102a and 102b each include a gate structure 116 having a gate electrode and a gate dielectric extending over the one or more semiconductor regions in the second direction to form transistor gates. A given gate structure may extend over the semiconductor regions of more than one semiconductor device.

As noted above, gate structures 116 extend in the second direction over one or more semiconductor regions of various devices and include both a gate electrode and a gate dielectric. The gate electrode may include any sufficiently conductive material such as a metal, metal alloy, or doped polysilicon. In some embodiments, the gate electrode includes one or more workfunction metals around the one or more semiconductor regions. In some embodiments, p-channel devices include a workfunction metal having titanium around its one or more semiconductor regions and n-channel devices include a workfunction metal having tungsten around its one or more semiconductor regions. The gate electrode may also include a fill metal or other conductive material around the workfunction metals to provide the whole gate electrode structure. The gate dielectric represents any number of dielectric layers that exist between the one or more semiconductor regions (e.g., nanoribbons 108) and the gate electrode.

According to some embodiments, spacer structures 118 are present on the sidewalls of gate structures 116 and define a gate trench through which gate structures 116 are formed. Spacer structures 118 may include any suitable dielectric material such as silicon nitride or silicon oxynitride.

According to some embodiments, a dielectric fill 120 is present between adjacent source or drain regions 110 along the second direction to provide electrical isolation between the various source or drain regions 110. Dielectric fill 120 may be any suitable dielectric material, such as silicon oxide.

Portions of dielectric fill 120 are removed around source or drain regions 110 to form the conductive contacts 112. These etches may be defined using one or more masking structures such as first masking structure 122 and second masking structure 124. According to some embodiments, each of masking structures 122/124 are plugs of dielectric material having a different composition than the dielectric material of dielectric fill 120. In one example, dielectric fill 120 is silicon oxide while masking structures 122/124 are silicon nitride. Other materials may be used as well such that there is a high etch selectivity between masking structures 122/124 and dielectric fill 120.

First masking structure 122 has a length along the second direction between adjacent source or drain regions 110 that is different than a length of second masking structure along the second direction between adjacent source or drain regions 110. The lengths of any given masking structure may be generally affected by the distance between the adjacent source or drain regions. In the illustrated example, the distance between the first and second source or drain regions 110 is less than the distance between the second and third source or drain regions 110. Thus, in this example, first masking structure 122 between the first and second source or drain regions 110 has a smaller length compared to second masking structure 124 between the second and third source or drain regions 110.

According to some embodiments, each of first masking structure 122 and second masking structure 124 has a substantially same thickness t (e.g., within 1 nm). In some examples, the thickness t is between about 5 nm and about 10 nm. The thickness of different masking structures may be substantially the same even when the masking structures have different lengths along the second direction, such as the illustrated example with first masking structure 122 and second masking structure 124.

Fabrication Methodology

FIGS. 2A-12A and 2B-12B are cross-sectional views that collectively illustrate an example process for forming an integrated circuit configured with substantially uniform gate contact masking structures, in accordance with an embodiment of the present disclosure. FIGS. 2A-12A represent cross-sectional views taken across a portion of the integrated circuit along a first direction, while FIGS. 2B-12B represent cross-sectional views taken across the portion of the integrated circuit along a second direction orthogonal to the first direction. Each figure shows an example structure that results from the process flow up to that point in time, so the depicted structure evolves as the process flow continues, culminating in the structure shown in FIGS. 12A and 12B, which is similar to the structure shown in FIGS. 1A and 1B, respectively. Such a structure may be part of an overall integrated circuit (e.g., such as a processor or memory chip) that includes, for example, digital logic cells and/or memory cells and analog mixed signal circuitry. Thus, the illustrated integrated circuit structure may be part of a larger integrated circuit that includes other integrated circuitry not depicted. Example materials and process parameters are given, but the present disclosure is not intended to be limited to any specific such materials or parameters, as will be appreciated. Figures sharing the same number (e.g., FIGS. 2A and 2B) illustrate different views of the structure at the same point in time during the process flow.

Figure 2A:
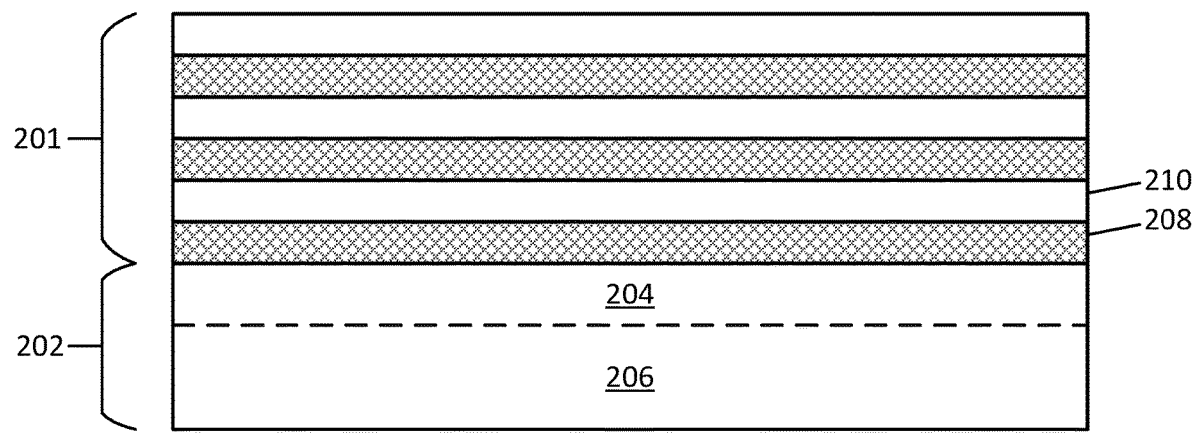
FIGS. 2A and 2B are cross-sectional views that illustrate one stage in an example process for forming an integrated circuit configured with topside dielectric plugs, in accordance with an embodiment of the present disclosure.
Figure 2B:
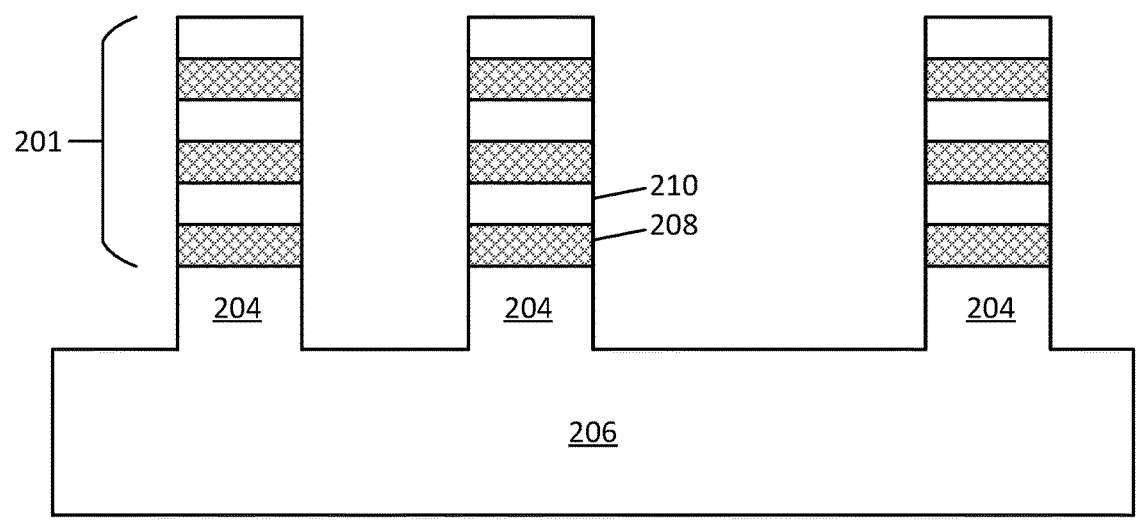

FIGS. 2A and 2B illustrate cross-sectional views taken through and parallel to a fin 201 of one of the semiconductor devices (FIG. 2A) formed over a semiconductor substrate 202 and taken across the area where the source or drain region will be that is perpendicular to a length of fin 201 (FIG. 2B). In this example, fin 201 includes alternating layers of material in order to ultimately form nanowires or nanoribbons in a gate-all-around (GAA) structure. In other examples, fin 201 includes a single semiconductor material (e.g., silicon or germanium). Substrate 202 can be, for example, any type of substrate as described above for substrate 101. Substrate 202 may include a subfin 204 and a bulk region 206 as seen more clearly in FIG. 2B.

In this example, fin 201 includes alternating layers of sacrificial layers 208 and semiconductor layers 210. Semiconductor layers 210 may include silicon, germanium, or an alloy thereof. Sacrificial layers 208 have a different material composition than semiconductor layers 210. In some embodiments, sacrificial layers 208 include some combination of silicon and germanium.

As seen in FIG. 2B, each fin rests on a corresponding subfin 204 that extends above bulk portion 206 of substrate 101. An anisotropic etching process along with lithographic patterning may be used to remove exposed portions of the alternating layer stack and portions of substrate 101 to form the plurality of parallel fins 201 running lengthwise along the first direction. As seen in FIG. 2B, the distance between adjacent fins may not be consistent.

While dimensions can vary from one example embodiment to the next, in one example case, the total height of fin 201 may be between 50 nm and 150 nm, and the width of fin 201 can be, for example, in the range of 5 to 100 nm. The thickness of each of semiconductor layer 210 and sacrificial layer 208 may be between about 5 nm and about 25 nm.

Figure 3A:
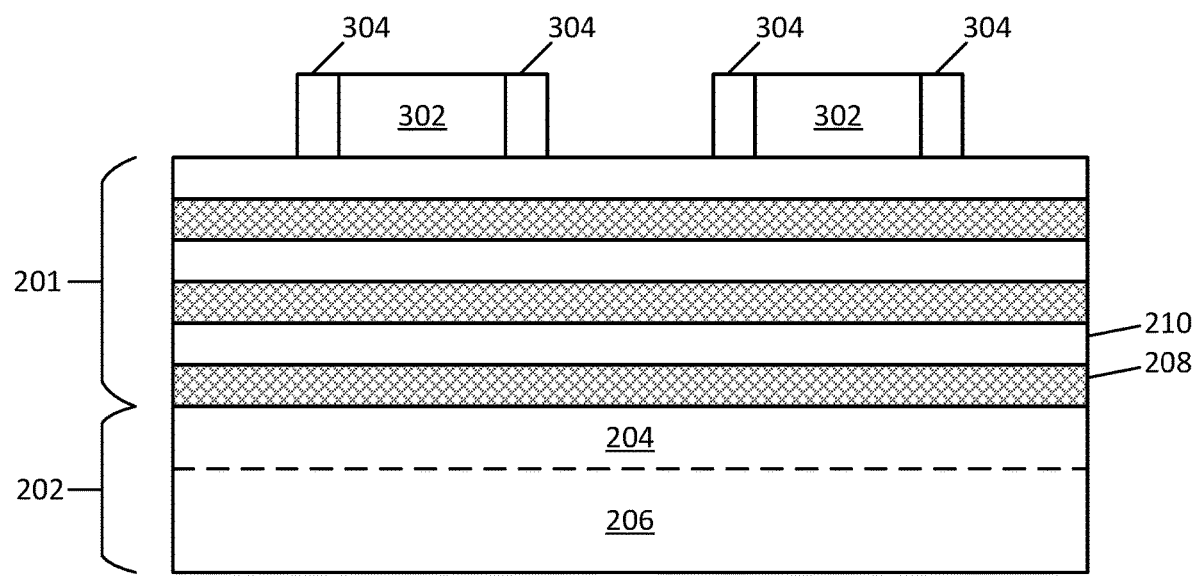
FIGS. 3A and 3B are cross-sectional views that illustrate another stage in the example process for forming an integrated circuit configured with topside dielectric plugs, in accordance with an embodiment of the present disclosure.
Figure 3B:
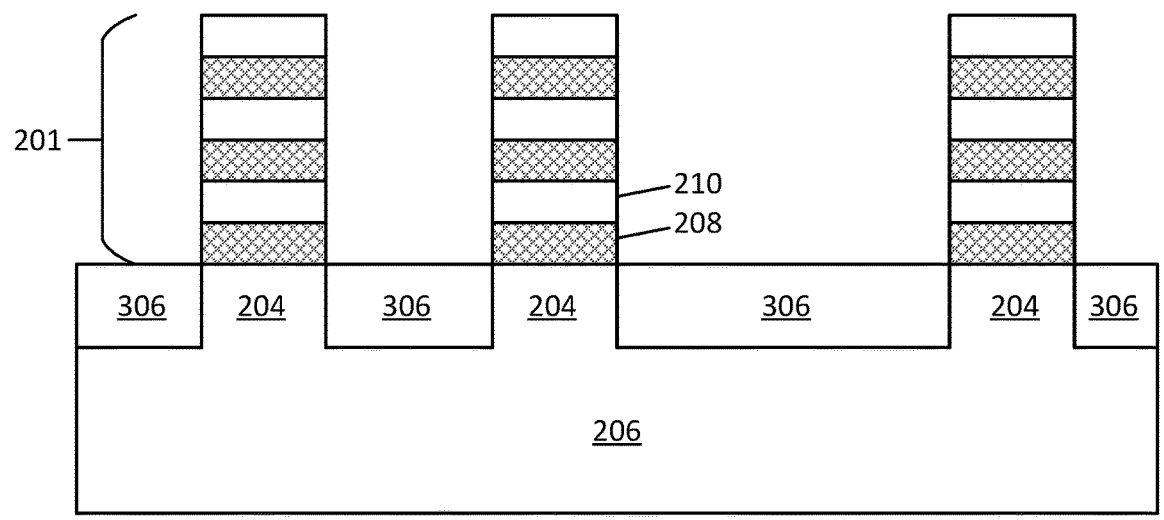

FIGS. 3A and 3B depict the cross-section views of the structure shown in FIGS. 2A and 2B, respectively, following the formation of sacrificial gate structures and shallow trench isolation (STI) regions. As seen in FIG. 3A, one or more sacrificial gates 302 are patterned over fin 201 and run in an orthogonal direction (e.g., along the second direction) to a length of fin 201. One or more sidewall spacer structures 304 are formed along the exposed sidewalls of sacrificial gates 302. Sidewall spacer structures 304 may be formed using an etch-back process where the material is deposited on all surfaces and then directionally etched away from horizontal surfaces leaving the material preferentially on the sidewalls of structures. Sacrificial gates 302 may include any material that can be safely removed later in the process without etching or otherwise damaging the sidewall spacer structures 304 and/or fin 201. Sidewall spacer structures 304 can include any suitable dielectric material, such as silicon nitride. Some portion of sidewall spacer structures 304 may also develop on the sidewalls of any of fins 201, according to some embodiments.

As seen in FIG. 2B, fins 201 extend above a dielectric layer 306 that acts as an STI region between adjacent fins. Dielectric layer 306 may include silicon oxide. According to some embodiments, each semiconductor device includes subfin 204 beneath fin 201 and between dielectric layer 306.

Figure 4A:
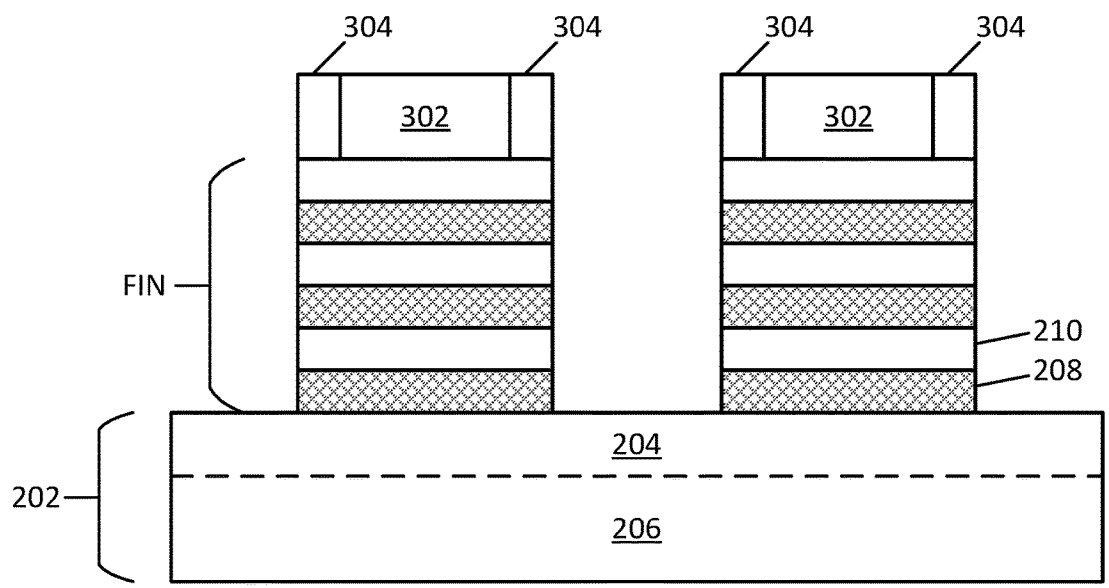
FIGS. 4A and 4B are cross-sectional views that illustrate another stage in the example process for forming an integrated circuit configured with topside dielectric plugs, in accordance with an embodiment of the present disclosure.
Figure 4B:
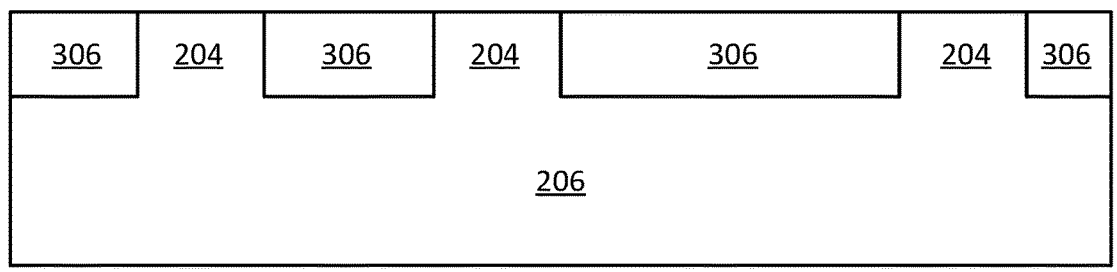

FIGS. 4A and 4B depict the cross-section views of the structure shown in FIGS. 3A and 3B, respectively, following the removal of the exposed fins not under sacrificial gate 302 and sidewall spacer structures 304. According to some embodiments, both semiconductor layers 210 and sacrificial layers 208 are etched at substantially the same rate using an anisotropic RIE process. As observed in FIG. 4A, the width of sidewalls spacer structures 304 works to define the length of each fin that in turn defines each semiconductor device. In some embodiments, some undercutting occurs along the edges of the fins beneath sidewall spacer structures 304 such that the length is not exactly the same as a sum of the widths of sidewall spacer structures 304 and a width of sacrificial gate 302. As observed in FIG. 3B, the fins are completely removed above subfins 204. In some embodiments, the RIE process may also etch into subfin 204 thus recessing subfin 204 beneath a top surface of dielectric layer 306. Other materials adjacent to or directly on the fin may also be removed, such as portions of sidewall spacer structures 304, in the view depicted in FIG. 3B.

Figure 5A:
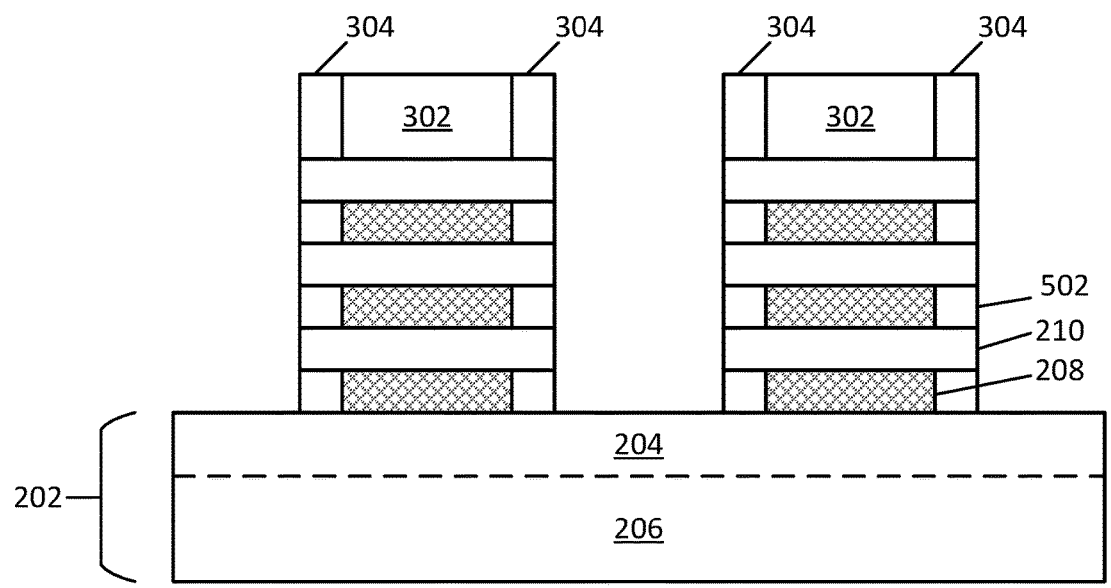
FIGS. 5A and 5B are cross-sectional views that illustrate another stage in the example process for forming an integrated circuit configured with topside dielectric plugs, in accordance with an embodiment of the present disclosure.
Figure 5B:
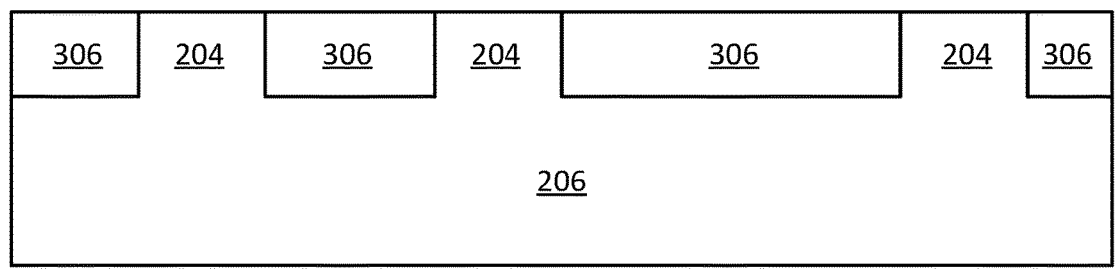

FIGS. 5A and 5B depict the cross-section views of the structure shown in FIGS. 4A and 4B, respectively, following the formation of inner spacers 502. According to some embodiments, prior to the deposition of inner spacers 502, the exposed ends of sacrificial layers 208 are laterally recessed using an isotropic etching process that selectively etches sacrificial layers 208 as opposed to semiconductor layers 210. Afterwards, a dielectric material is deposited to effectively fill the dimples between semiconductor layers 210, according to some embodiments. The dielectric material can then be etched back using RIE or a wet isotropic etch at least until the ends of semiconductor layers 210 are exposed, thus forming inner spacers 502. In some embodiments, inner spacers 502 wrap around end portions of semiconductor layers 210. According to some embodiments, inner spacers 502 have the same material composition as sidewall spacer structures 304. It should be noted that inner spacers 502 may only be present when using a gate-all-around (GAA) structure having semiconductor nanoribbons or nanowires.

Figure 6A:
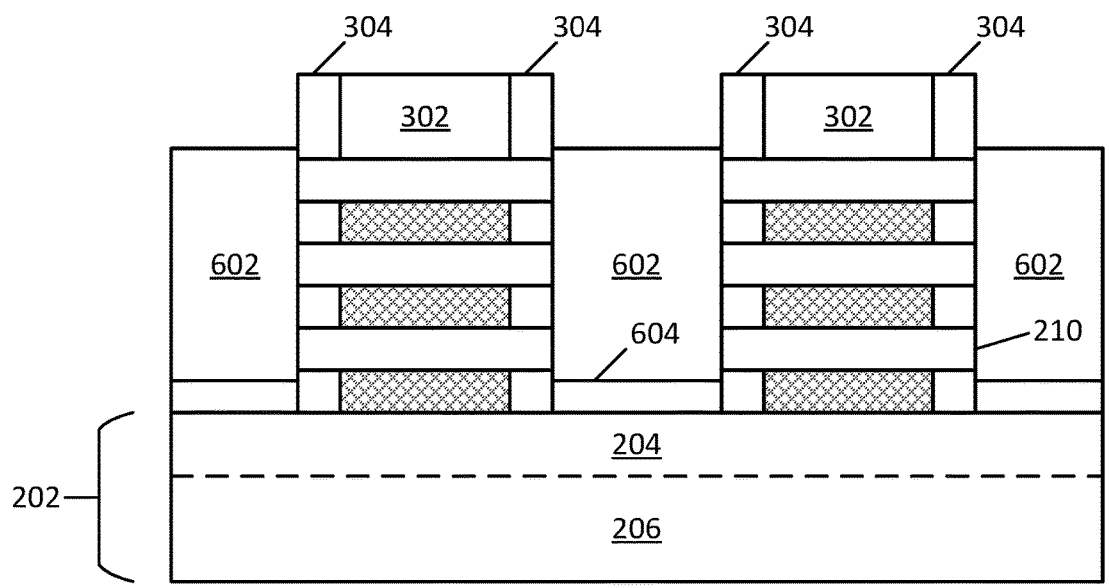
FIGS. 6A and 6B are cross-sectional views that illustrate another stage in the example process for forming an integrated circuit configured with topside dielectric plugs, in accordance with an embodiment of the present disclosure.
Figure 6B:
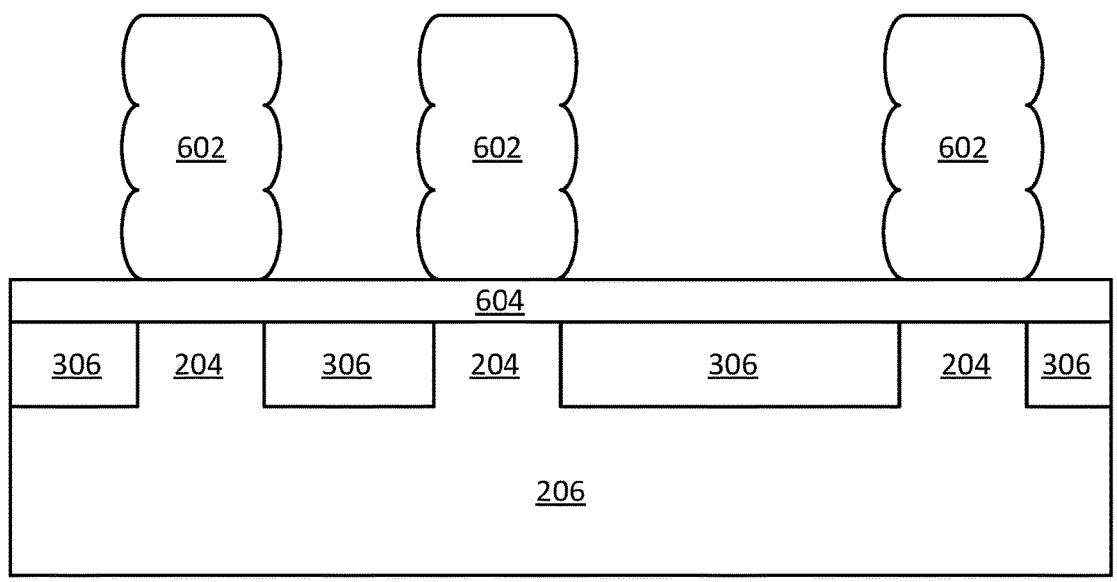

FIGS. 6A and 6B depict the cross-section views of the structure shown in FIGS. 5A and 5B, respectively, following the formation of source or drain regions 602 between the fins, according to some embodiments. Source or drain regions 602 may be epitaxially grown from the exposed ends of semiconductor layers 210, such that the material grows together or otherwise merges towards the middle of the trenches between fins, according to some embodiments. In other embodiments, the epitaxial growth may only partially merge, or not merge at all thereby leaving space between the laterally adjacent epi-growths in which contact material can be deposited. Such embodiments may further increase contact surface area and thus further lower contact resistance. Further note that epitaxial growth on one semiconductor layer 210 can fully or partially merge with epitaxial growth on one or more other semiconductor layers 210 in the same vertical stack. The degree of any such merging can vary from one embodiment to the next. In the example of a PMOS device, a given source or drain region 602 may be a semiconductor material (e.g., group IV or group III-V semiconductor materials) having a higher dopant concentration of p-type dopants compared to n-type dopants. In the example of an NMOS device, a given source or drain region 602 may be a semiconductor material (e.g., group IV or group III-V semiconductor materials) having a higher dopant concentration of n-type dopants compared to p-type dopants. According to some embodiments, the various source or drain regions 602 grown from different semiconductor devices may be aligned along the second direction as shown in FIG. 6B.

According to some embodiments, a bottom dielectric layer 604 may be deposited prior to the formation of source or drain regions 602. Bottom dielectric layer 604 may be any suitable dielectric material, such as silicon oxide, silicon nitride, or silicon oxynitride. Bottom dielectric layer 604 may be provided to provide isolation between source or drain regions 602 and subfins 204.

Figure 7A:
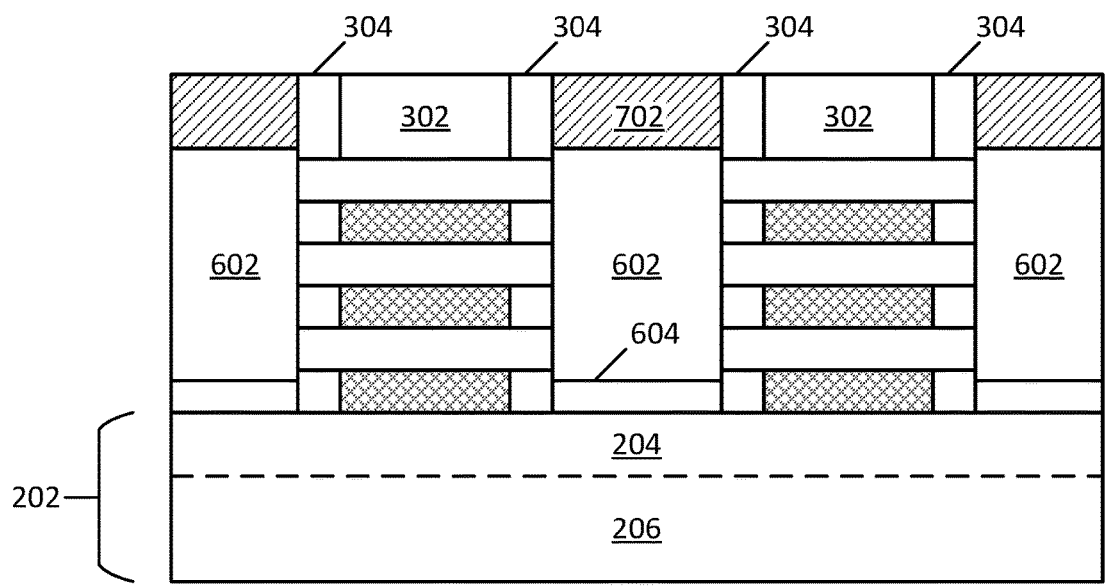
FIGS. 7A and 7B are cross-sectional views that illustrate another stage in the example process for forming an integrated circuit configured with topside dielectric plugs, in accordance with an embodiment of the present disclosure.
Figure 7B:
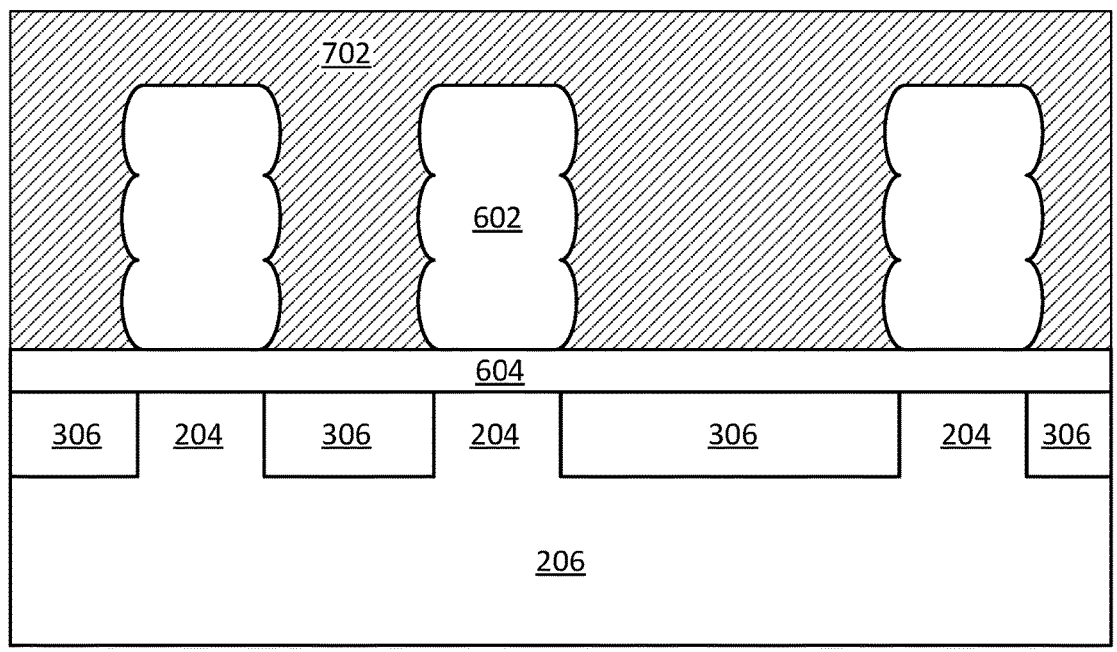

FIGS. 7A and 7B depict the cross-section views of the structure shown in FIGS. 6A and 6B, respectively, following the formation of dielectric fill 702, according to some embodiments. Dielectric fill 702 extends between adjacent ones of the source or drain regions 602 along the second direction and also extends up and over each of the source or drain regions 602, according to some embodiments. Accordingly, each source or drain region 602 may be isolated from any adjacent source or drain regions 602 by dielectric fill 702. Dielectric fill 702 may be any suitable dielectric material, although in some embodiments, dielectric fill 702 includes the same dielectric material as dielectric layer 306 or bottom dielectric layer 604. In one example, each of dielectric fill 702, bottom dielectric layer 604, and dielectric layer 306 includes silicon oxide. Dielectric fill 702 may not be present in situations where adjacent source or drain regions are desired to be electrically coupled together. According to some embodiments, a top surface of dielectric fill 702 may be polished using, for example, chemical mechanical polishing (CMP). The top surface of dielectric fill 702 may be polished until it is substantially planar with a top surface of sacrificial gates 302 and/or spacer structures 304.

Figure 8A:
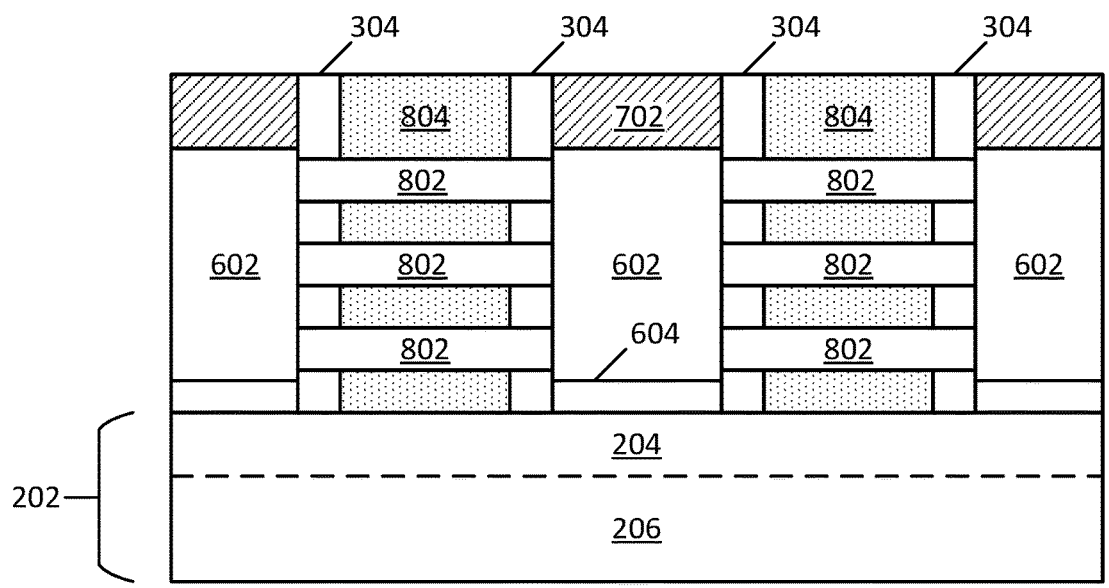
FIGS. 8A and 8B are cross-sectional views that illustrate another stage in the example process for forming an integrated circuit configured with topside dielectric plugs, in accordance with an embodiment of the present disclosure.
Figure 8B:
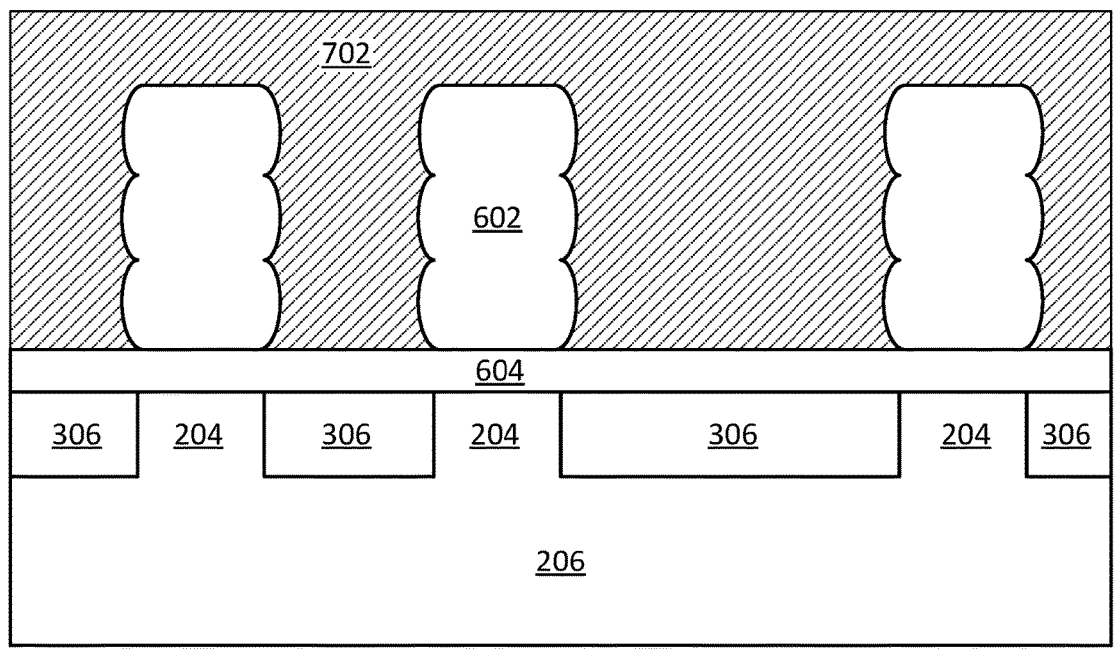

FIGS. 8A and 8B depict the cross-section views of the structure shown in FIGS. 7A and 7B, respectively, following the formation of nanoribbons 802 and a gate structure 804 around nanoribbons 802 of each semiconductor device, according to some embodiments. Depending on the dimensions of the structures, nanoribbons 802 may also be considered nanowires or nanosheets. Sacrificial gates 302 may be removed using any wet or dry isotropic process thus exposing the alternating layer stack of the fins within the trenches left behind after the removal of sacrificial gates 302. Once sacrificial gates 302 are removed, sacrificial layers 208 may also be removed using a selective isotropic etching process that removes the material of sacrificial layers 208 but does not remove (or removes very little of) semiconductor layers 210. At this point, the suspended (sometimes called released) semiconductor layers 210 form nanoribbons 802 that extend between a first source or drain region 602 and a second source or drain region 602 on the opposite ends of nanoribbons 802.

As noted above, gate structure 804 includes a gate dielectric and a gate electrode. The gate dielectric may be conformally deposited around nanoribbons 802 using any suitable deposition process, such as atomic layer deposition (ALD). The gate dielectric may include any suitable dielectric (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, the gate dielectric is hafnium oxide with a thickness between about 1 nm and about 5 nm. In some embodiments, the gate dielectric may include one or more silicates (e.g., titanium silicate, tungsten silicate, niobium silicate, and silicates of other transition metals). The gate dielectric may be a multilayer structure, in some examples. For instance, the gate dielectric may include a first layer on nanoribbons 802, and a second layer on the first layer. The first layer can be, for instance, an oxide of the semiconductor layers (e.g., silicon dioxide) and the second layer can be a high-k dielectric material (e.g., hafnium oxide). In some embodiments, an annealing process may be carried out on the gate dielectric to improve its quality when a high-k dielectric material is used. In some embodiments, the high-k material can be nitridized to improve its aging resistance.

The gate electrode may be deposited over the gate dielectric and can be any standard or proprietary gate structure that may include any number of gate cuts. In some embodiments, the gate electrode includes doped polysilicon, a metal, or a metal alloy. Example suitable metals or metal alloys include aluminum, tungsten, cobalt, molybdenum, ruthenium, titanium, tantalum, copper, and carbides and nitrides thereof. The gate electrode may include, for instance, one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates.

Figure 9A:
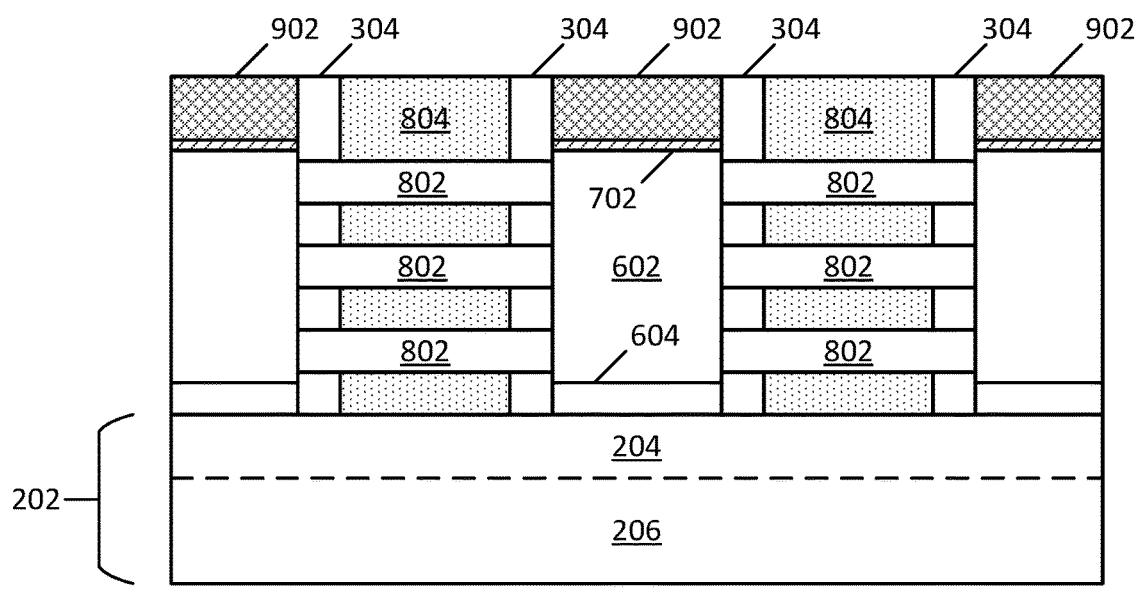
FIGS. 9A and 9B are cross-sectional views that illustrate another stage in the example process for forming an integrated circuit configured with topside dielectric plugs, in accordance with an embodiment of the present disclosure.
Figure 9B:
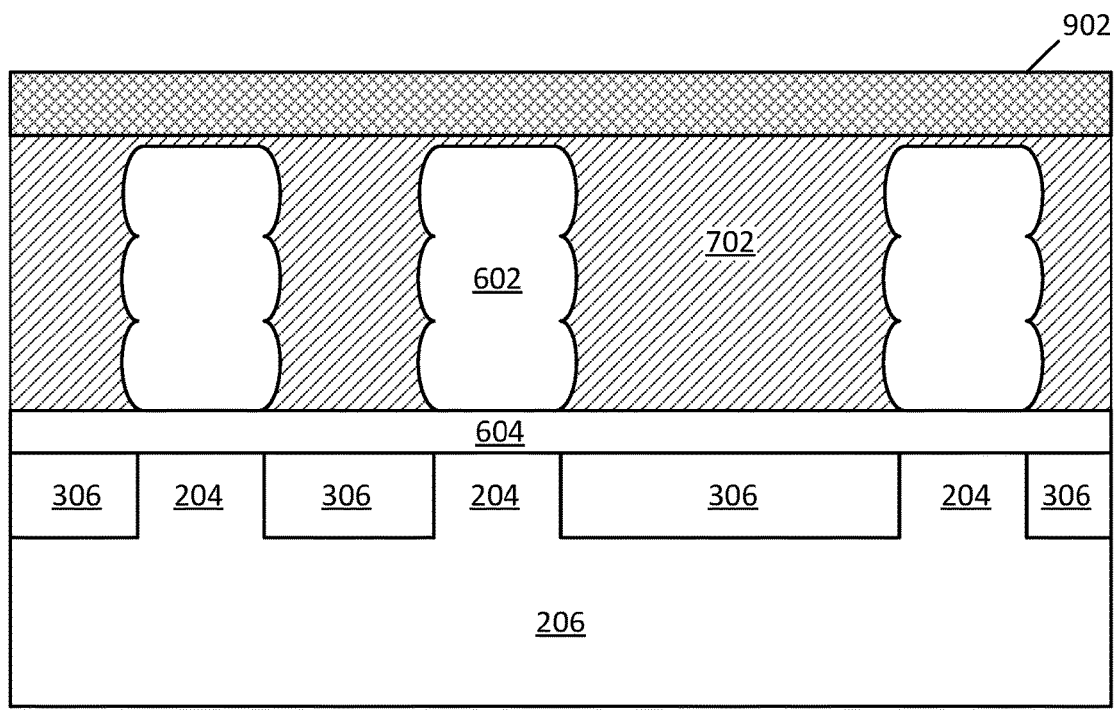

FIGS. 9A and 9B depict the cross-section views of the structure shown in FIGS. 8A and 8B, respectively, following the recessing of dielectric fill 702 and formation of sacrificial material 902 within the recessed area. Dielectric fill 702 may be recessed using an isotropic etching process such that the top surface of dielectric fill 702 still remains above source or drain regions 602. Accordingly, as seen in FIG. 9A, a thin layer of dielectric fill 702 may remain over source or drain region 602. Sacrificial material 902 may be formed within the recess over dielectric fill 702. According to some embodiments, sacrificial material 902 may be any suitable material exhibiting high etch selectivity with any other surrounding dielectric material. In some embodiments, sacrificial material 902 includes polysilicon, titanium nitride (TiN), titanium oxide ($TiO_2$), carbon hard mask (CHM), or tungsten. A top surface of sacrificial material 902 may be polished using, for example, chemical mechanical polishing (CMP) to level the top surface of sacrificial material 902 with a top surface of at least sidewall spacer structures 304 and/or gate structures 804. In some other examples, the top surface of sacrificial material 902 is polished to be level with another dielectric material formed over sidewall spacer structures 304 and/or gate structures 804.

Figure 10A:
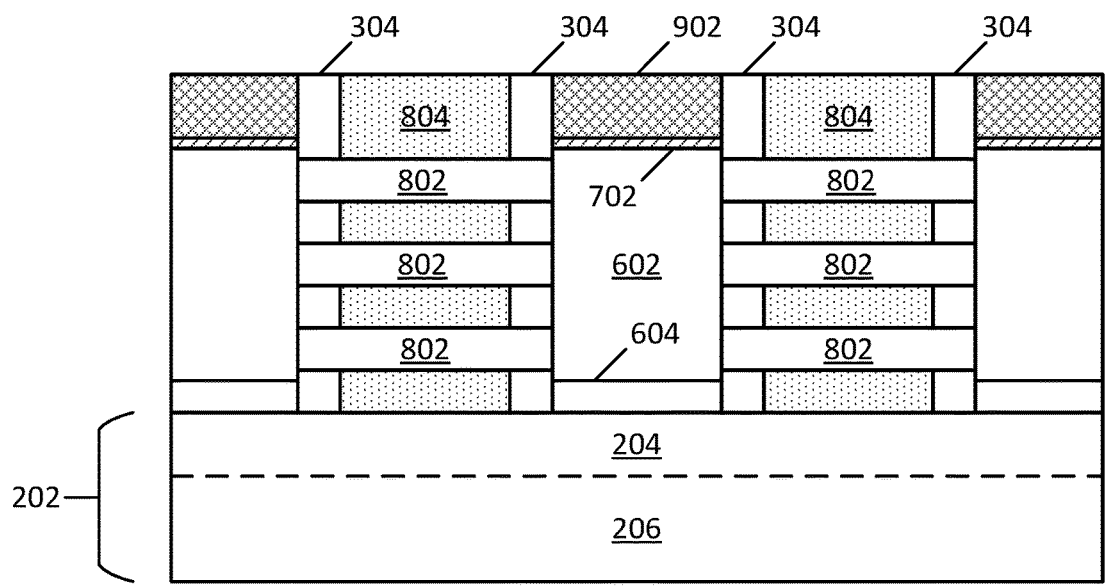
FIGS. 10A and 10B are cross-sectional views that illustrate another stage in the example process for forming an integrated circuit configured with topside dielectric plugs, in accordance with an embodiment of the present disclosure.
Figure 10B:
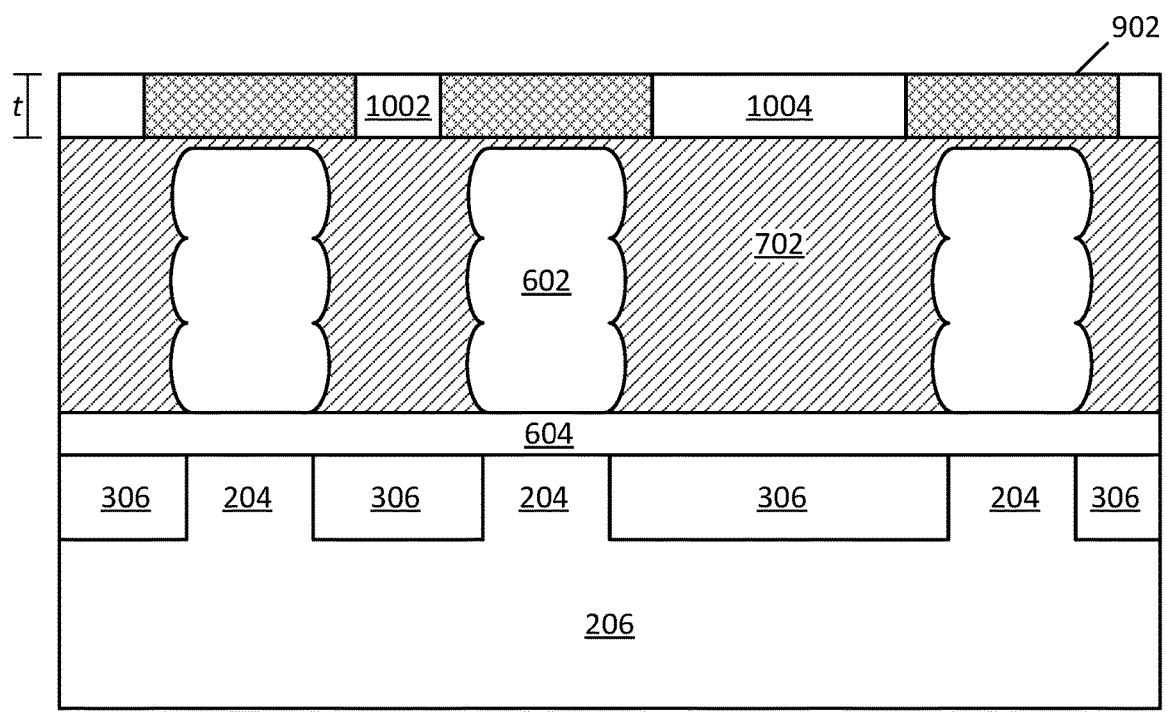

FIGS. 10A and 10B depict the cross-section views of the structure shown in FIGS. 9A and 9B, respectively, following the lithographic patterning of sacrificial material 902 and subsequent formation of masking structures. According to some embodiments, sacrificial material 902 may be etched using any known lithographic technique to form recesses aligned between adjacent pairs of source or drain regions 602. An anisotropic etching process may be used to selectively remove exposed areas of sacrificial material 902 until the top surface of dielectric fill 702 is reached. In this way, each of the etched recesses within sacrificial material 902 will have substantially the same depth as they each stop along the same top surface of dielectric fill 702.

Masking structures may be formed within the etched recesses through sacrificial material 902, such as first masking structure 1002 and second masking structure 1004. According to some embodiments, each of masking structures 1002/1004 are plugs of dielectric material having a different composition than the dielectric material of dielectric fill 702. In one example, dielectric fill 702 is silicon oxide while masking structures 1002/1004 are silicon nitride. Other materials may be used as well such that there is a high etch selectivity between masking structures 1002/1004 and dielectric fill 702 (e.g., oxide for one and carbide for the other; nitride for one and carbide for the other; or other such etch selective material schemes).

Due to the different distances between the adjacent source or drain regions 602, first masking structure 1002 has a length along the second direction between adjacent source or drain regions 602 that is shorter than a length of second masking structure 1004 along the second direction between adjacent source or drain regions 602. The relative lengths of different masking structures across an integrated circuit may vary. A top surface of masking structures 1002/1004 may be polished using CMP to be substantially planar with a top surface of sacrificial material 902.

According to some embodiments, each of first masking structure 1002 and second masking structure 1004 has a substantially same thickness t (e.g., within 1 nm). In some examples, the thickness t is between about 5 nm and about 10 nm. The thickness of different masking structures may be substantially the same even when the masking structures have different lengths along the second direction, such as the illustrated example with first masking structure 1002 and second masking structure 1004. Loading effects due to etching differently sized areas are reduced or eliminated through the use of sacrificial material 902 and a common etch-stop surface (e.g., the top surface of dielectric fill 702).

Figure 11A:
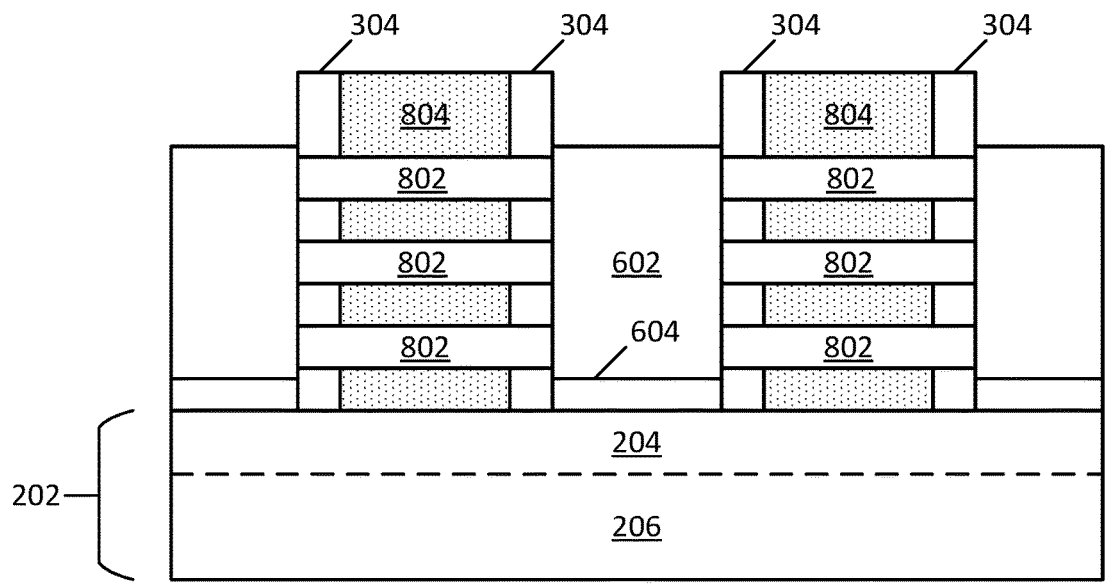
FIGS. 11A and 11B are cross-sectional views that illustrate another stage in the example process for forming an integrated circuit configured with topside dielectric plugs, in accordance with an embodiment of the present disclosure.
Figure 11B:
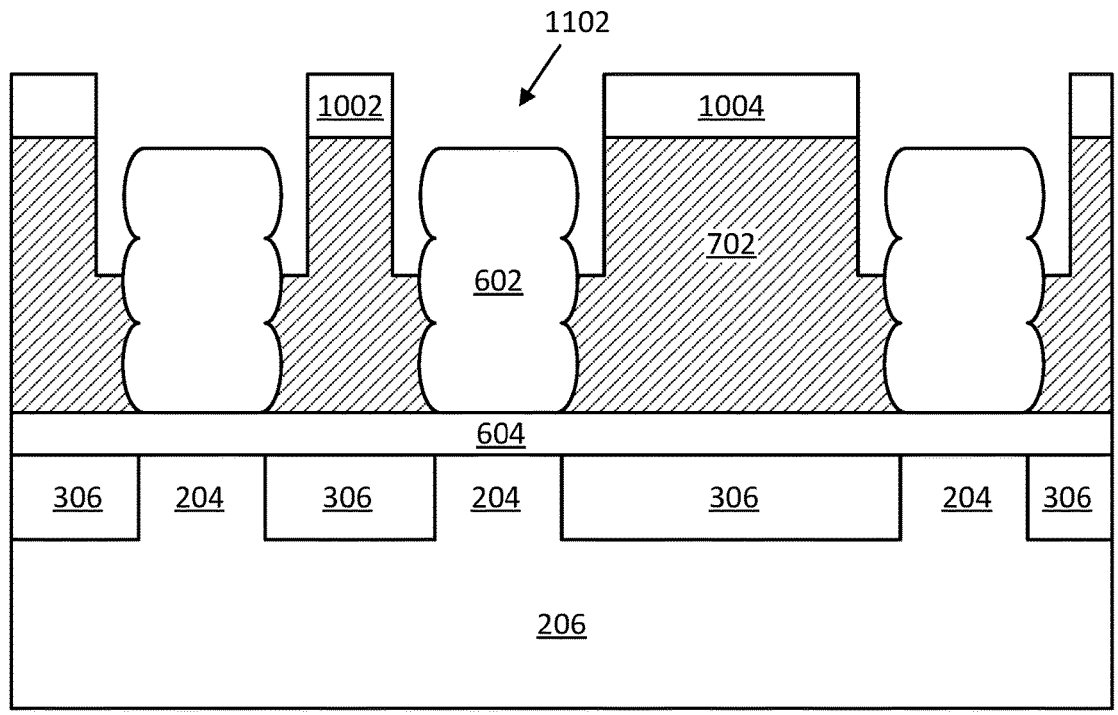

FIGS. 11A and 11B depict the cross-section views of the structure shown in FIGS. 10A and 10B, respectively, following the removal of exposed remaining sacrificial material 902 and formation of recesses 1102 through dielectric fill 702 around source or drain regions 602. According to some embodiments, portions of dielectric fill 702 between masking structures 1002 and 1004 are removed using a suitable anisotropic etch that selectivity removes the material of dielectric fill 702 without removing source or drain region 602. Masking structures 1002 and 1004 also act as a hard mask during the etching process, according to some embodiments. As seen in FIG. 11B, portions of dielectric fill 702 are removed from above a top surface of source or drain regions 602 and may also be removed one or more sides of source or drain regions 602.

Figure 12A:
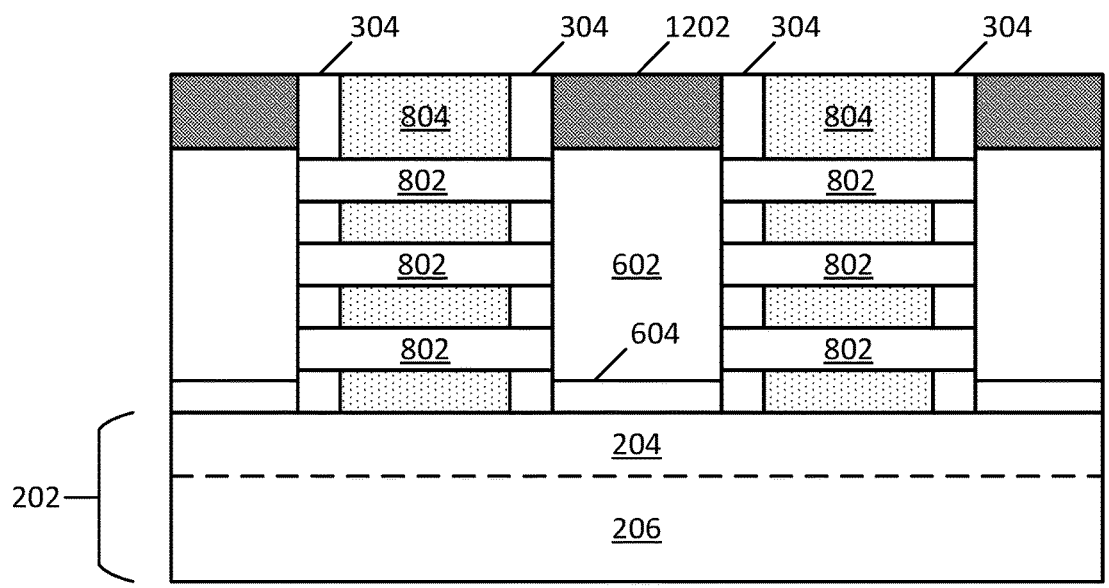
FIGS. 12A and 12B are cross-sectional views that illustrate another stage in the example process for forming an integrated circuit configured with topside dielectric plugs, in accordance with an embodiment of the present disclosure.
Figure 12B:
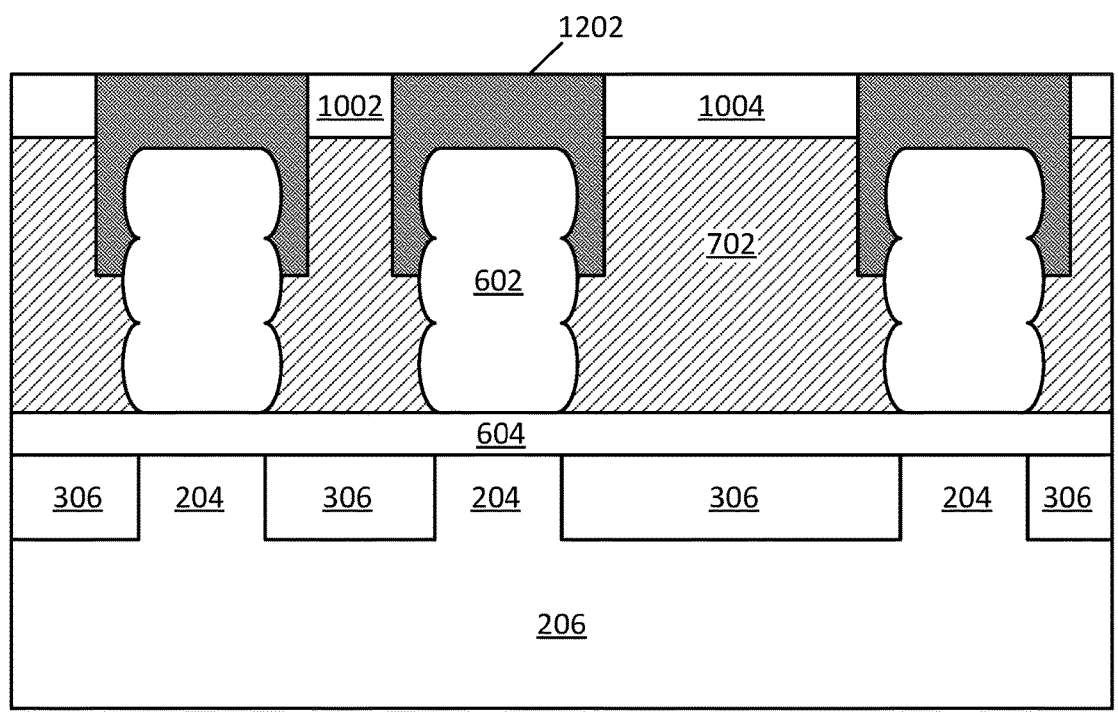

FIGS. 12A and 12B depict the cross-section views of the structure shown in FIGS. 11A and 11B, respectively, following the formation of conductive contacts 1202. According to some embodiments, conductive contacts 1202 may be any suitably conductive material such as tungsten (W). Other conductive materials may include copper (Cu), ruthenium (Ru), cobalt (Co), titanium (Ti), molybdenum (Mo), or any alloys thereof. Conductive contacts 1202 may be formed within the recesses 1102 formed through dielectric fill 702 around the source or drain regions 602. Conductive contacts 1202 may be formed by depositing a suitable conductive material using any deposition process such as CVD or PVD. A top surface of conductive contacts 1202 may be polished using CMP to be substantially planar with a top surface of masking structures 1002/1004.

Figure 13:
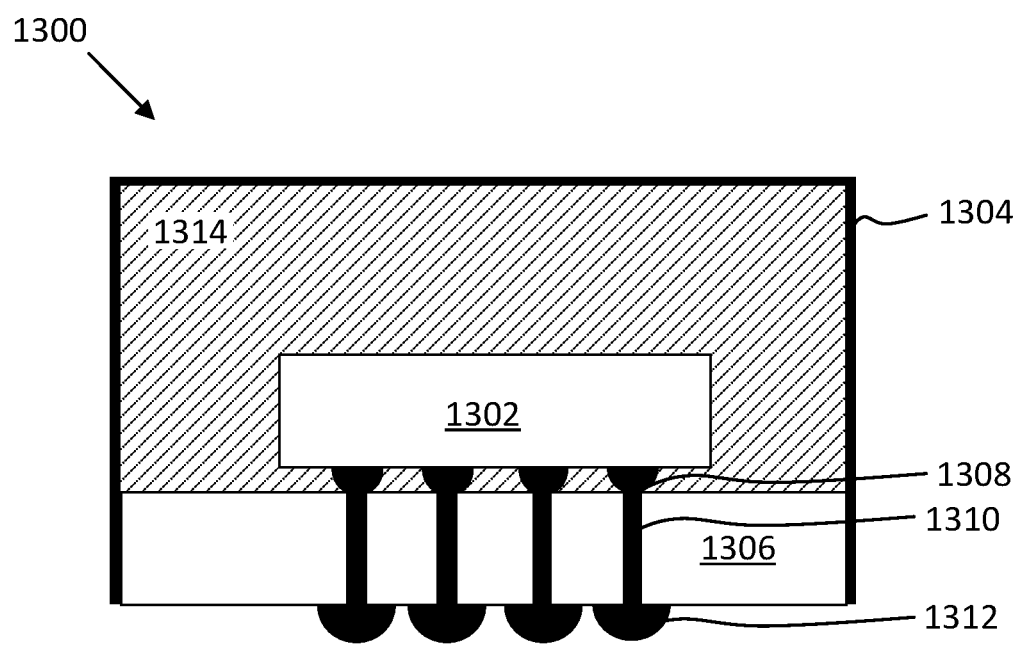
FIG. 13 illustrates a cross-section view of a chip package containing one or more semiconductor dies, in accordance with some embodiments of the present disclosure.

FIG. 13 illustrates an example embodiment of a chip package 1300. As can be seen, chip package 1300 includes one or more dies 1302. One or more dies 1302 may include at least one integrated circuit having semiconductor devices, such as any of the semiconductor devices disclosed herein. One or more dies 1302 may include any other circuitry used to interface with other devices formed on the dies, or other devices connected to chip package 1300, in some example configurations.

As can be further seen, chip package 1300 includes a housing 1304 that is bonded to a package substrate 1306. The housing 1304 may be any standard or proprietary housing, and provides, for example, electromagnetic shielding and environmental protection for the components of chip package 1300. The one or more dies 1302 may be conductively coupled to a package substrate 1306 using connections 1308, which may be implemented with any number of standard or proprietary connection mechanisms, such as solder bumps, ball grid array (BGA), pins, or wire bonds, to name a few examples. Package substrate 1306 may be any standard or proprietary package substrate, but in some cases includes a dielectric material having conductive pathways (e.g., including conductive vias and lines) extending through the dielectric material between the faces of package substrate 1306, or between different locations on each face. In some embodiments, package substrate 1306 may have a thickness less than 1 millimeter (e.g., between 0.1 millimeters and 0.5 millimeters), although any number of package geometries can be used. Additional conductive contacts 1312 may be disposed at an opposite face of package substrate 1306 for conductively contacting, for instance, a printed circuit board (PCB). One or more vias 1310 extend through a thickness of package substrate 1306 to provide conductive pathways between one or more of connections 1308 to one or more of contacts 1312. Vias 1310 are illustrated as single straight columns through package substrate 1306 for ease of illustration, although other configurations can be used (e.g., damascene, dual damascene, through-silicon via). In still other embodiments, vias 1310 are fabricated by multiple smaller stacked vias, or are staggered at different locations across package substrate 1306. In the illustrated embodiment, contacts 1312 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 1312, to inhibit shorting.

In some embodiments, a mold material 1314 may be disposed around the one or more dies 1302 included within housing 1304 (e.g., between dies 1302 and package substrate 1306 as an underfill material, as well as between dies 1302 and housing 1304 as an overfill material). Although the dimensions and qualities of the mold material 1314 can vary from one embodiment to the next, in some embodiments, a thickness of mold material 1314 is less than 1 millimeter. Example materials that may be used for mold material 1314 include epoxy mold materials, as suitable. In some cases, the mold material 1314 is thermally conductive, in addition to being electrically insulating.

Methodology

Figure 14:
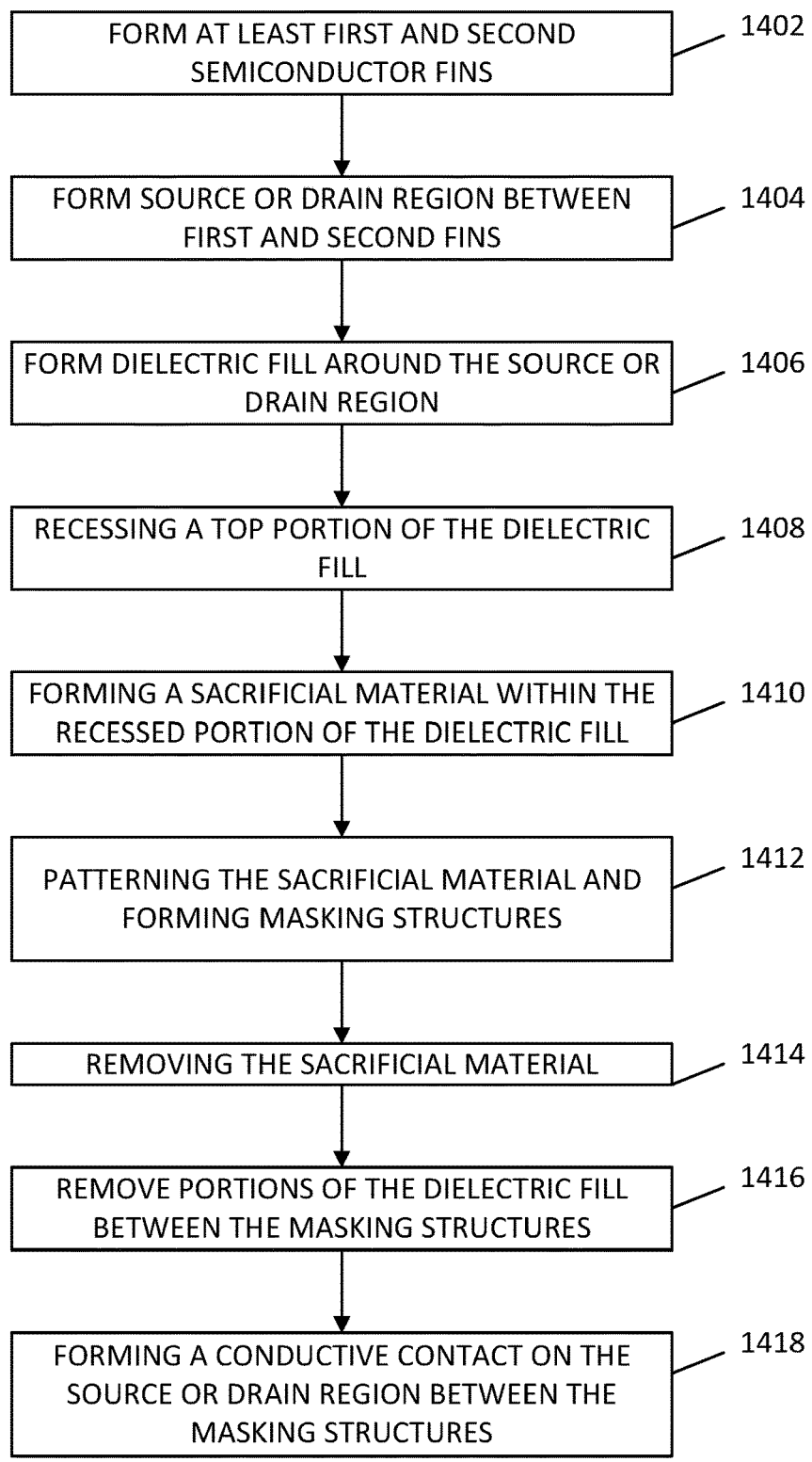
FIG. 14 is a flowchart of a fabrication process for a semiconductor device having topside dielectric plugs, in accordance with an embodiment of the present disclosure.

FIG. 14 is a flow chart of a method 1400 for forming at least a portion of an integrated circuit, according to an embodiment. Various operations of method 1400 may be illustrated in FIGS. 2A-12A and 2B-12B. However, the correlation of the various operations of method 1400 to the specific components illustrated in the aforementioned figures is not intended to imply any structural and/or use limitations. Rather, the aforementioned figures provide one example embodiment of method 1400. Other operations may be performed before, during, or after any of the operations of method 1400. Some of the operations of method 1400 may be performed in a different order than the illustrated order.

Method 1400 begins with operation 1402 where at least first and second collinear semiconductor fins are formed extending together in a first direction, according to some embodiments. The semiconductor material in the fins may be formed from a substrate such that the fins are an integral part of the substrate (e.g., etched from a bulk silicon substrate). Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around process can then be carried out. Again, the alternating layers can be blanket deposited and then etched into fins, or deposited into fin-shaped trenches.

Method 1400 continues with operation 1404 where a source or drain region is formed between the first and second fins. The source or drain region may be epitaxially grown from the exposed ends of semiconductor layers from the first and second fins, such that the material grows together towards the middle of the source/drain trench that extends in a second direction (orthogonal to the first direction) between the fins. In the example of a PMOS device, the source or drain region may be a semiconductor material (e.g., group IV or group III-V semiconductor materials) having a higher dopant concentration of p-type dopants compared to n-type dopants. In the example of an NMOS device, the source or drain region may be a semiconductor material (e.g., group IV or group III-V semiconductor materials) having a higher dopant concentration of n-type dopants compared to p-type dopants. In some examples, a bottom dielectric layer exists beneath the source or drain region to isolate the source or drain region from any underlying portion of the substrate.

Method 1400 continues with operation 1406 where a dielectric fill is formed around the source or drain region. The dielectric fill extends between the source or drain region and any adjacent source or drain regions along the second direction. The dielectric fill may also cover a top surface of the source or drain region. The dielectric fill may be any suitable dielectric material, such as silicon oxide, silicon nitride, or silicon oxynitride, to name a few examples. According to some embodiments, a top surface of the dielectric fill may be polished using, for example, CMP.

Method 1400 continues with operation 1408 where a top portion of the dielectric fill is recessed. According to some embodiments, the dielectric fill is recessed by an amount that does not expose the top surface of the source or drain region. The dielectric fill may be recessed using an isotropic etching process to a recess depth of between about 5 nm and about 10 nm.

Method 1400 continues with operation 1410 where a sacrificial material is formed within the recessed portion of the dielectric fill. Accordingly, the sacrificial material is formed over the source or drain region and extends lengthwise along the second direction. In some embodiments, a thin layer of dielectric fill is between the top surface of the source or drain region and the sacrificial material. According to some embodiments, the sacrificial material is any suitable material exhibiting high etch selectivity with any other surrounding dielectric material. In some embodiments, the sacrificial material includes polysilicon, titanium nitride (TiN), titanium oxide (TiO$_2$), carbon hard mask (CHM), or tungsten. The sacrificial material may be deposited using any deposition process such as CVD or PVD and polished using CMP.

Method 1400 continues with operation 1412 where the sacrificial material is patterned to form masking structures on either side of the source or drain region along the second direction. The sacrificial material may be etched using any known lithographic technique to form recesses through the sacrificial material on either side of the source or drain region. An anisotropic etching process may be used to selectively remove exposed areas of the sacrificial material until the top surface of the dielectric fill is reached. The masking structures may be formed within the etched recesses through the sacrificial material. According to some embodiments, each of the masking structures are plugs of dielectric material having a different composition than the dielectric material of the dielectric fill. The masking structures may be deposited using any deposition process such as CVD or PVD and polished using CMP to be substantially level with a top surface of the sacrificial material.

According to some embodiments, the masking structures may have different lengths along the second direction. Regardless of the lengths of any of the masking structures, each of the masking structures has a substantially same thickness above the dielectric fill. This is in contrast to other techniques that do not use a sacrificial material to set the height of the masking structures. The other techniques fall victim to loading effects during the etching processes that, for example, would cause longer masking structures to be thicker compared to shorter masking structures.

Method 1400 continues with operation 1414 where the sacrificial material is removed. The sacrificial material may be removed using any suitably selective isotropic etching process, such as ashing or using a selective wet or dry etchant.

Method 1400 continues with operation 1416 where portions of the dielectric fill are removed from around the source or drain region between the masking structures. According to some embodiments, portions of the dielectric fill between the masking structures are removed using a suitable anisotropic etch that selectivity removes the material of the dielectric fill without removing the source or drain region. The masking structures also act as a hard mask during the etching process. The dielectric fill may be removed from the top surface of the source or drain region and from around at least portions of side surfaces of the source or drain region.

Method 1400 continues with operation 1418 where a conductive contact is formed on the source or drain region between the masking structures. The conductive contact may be formed completely within the removed portion of the dielectric fill from around the source or drain region. The conductive contact may include any suitable conductive material such as tungsten (W). Other conductive materials may include copper (Cu), ruthenium (Ru), cobalt (Co), titanium (Ti), molybdenum (Mo), or any alloys thereof. The conductive material may be depositing using any deposition process such as CVD or PVD. The conductive contact may be considered a topside contact as it will make contact with topside interconnect structures above the semiconductor devices. According to some embodiments, a top surface of the conductive contact is polished to be planarized with a top surface of the masking structures.

Example System

Figure 15:
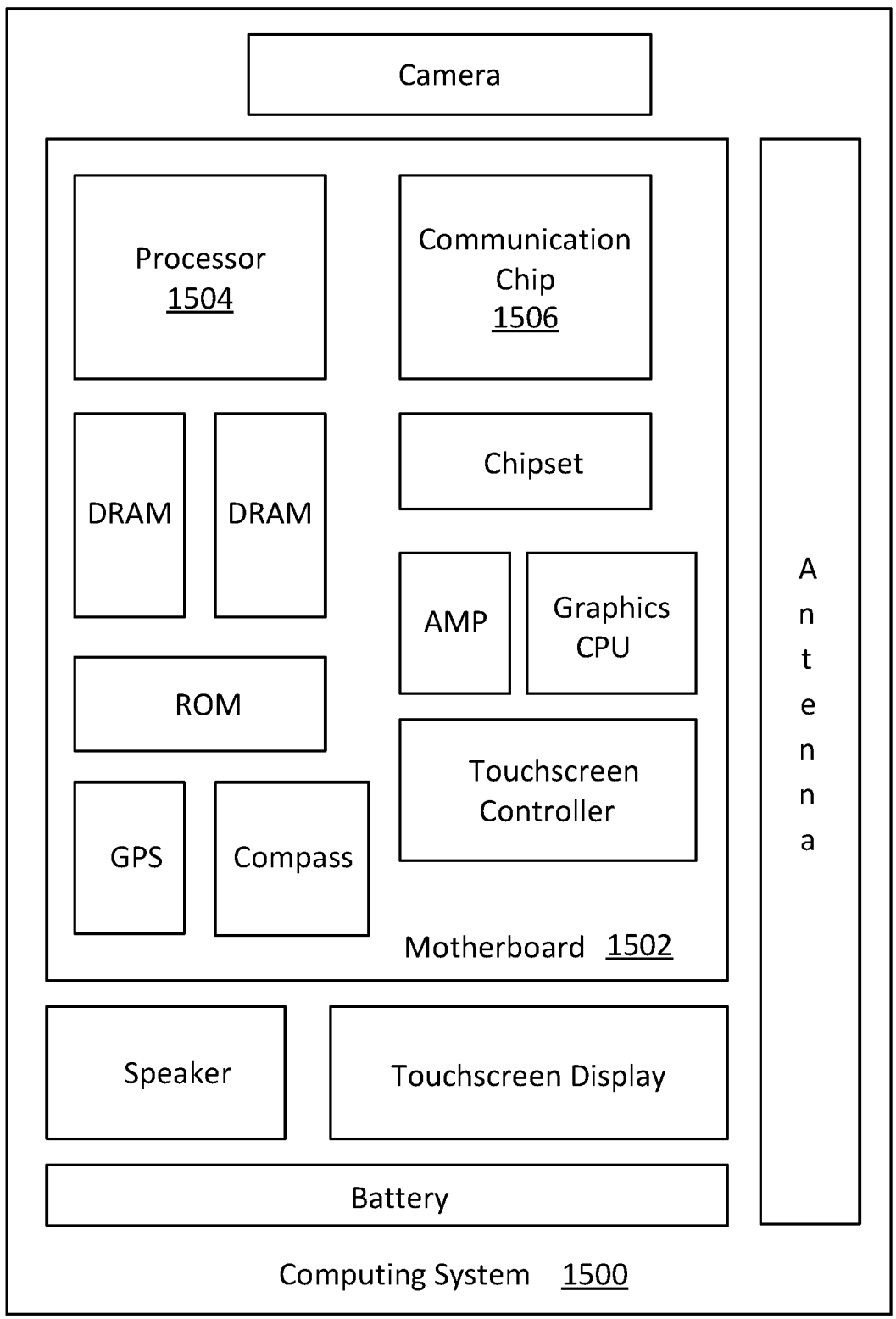
FIG. 15 illustrates a computing system including one or more integrated circuits, as variously described herein, in accordance with an embodiment of the present disclosure.

FIG. 15 is an example computing system implemented with one or more of the integrated circuit structures as disclosed herein, in accordance with some embodiments of the present disclosure. As can be seen, the computing system 1500 houses a motherboard 1502. The motherboard 1502 may include a number of components, including, but not limited to, a processor 1504 and at least one communication chip 1506, each of which can be physically and electrically coupled to the motherboard 1502, or otherwise integrated therein. As will be appreciated, the motherboard 1502 may be, for example, any printed circuit board (PCB), whether a main board, a daughterboard mounted on a main board, or the only board of system 1500, etc.

Depending on its applications, computing system 1500 may include one or more other components that may or may not be physically and electrically coupled to the motherboard 1502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1500 may include one or more integrated circuit structures or devices configured in accordance with an example embodiment (e.g., a module including an integrated circuit device on a substrate, the substrate having one or more semiconductor devices with masking structures between source or drain regions having a substantially uniform thickness). In some embodiments, multiple functions can be integrated into one or more chips (e.g., for instance, note that the communication chip 1506 can be part of or otherwise integrated into the processor 1504).

The communication chip 1506 enables wireless communications for the transfer of data to and from the computing system 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1506 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1500 may include a plurality of communication chips 1506. For instance, a first communication chip 1506 may be dedicated to shorter range wireless communications such as Wi-Fi and Bluetooth and a second communication chip 1506 may be dedicated to longer range wireless communications such as GPS, EDGE, GPRS, CDMA, WiMAX, LTE, Ev-DO, and others.

The processor 1504 of the computing system 1500 includes an integrated circuit die packaged within the processor 1504. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 1506 also may include an integrated circuit die packaged within the communication chip 1506. In accordance with some such example embodiments, the integrated circuit die of the communication chip includes one or more semiconductor devices as variously described herein. As will be appreciated in light of this disclosure, note that multi-standard wireless capability may be integrated directly into the processor 1504 (e.g., where functionality of any chips 1506 is integrated into processor 1504, rather than having separate communication chips). Further note that processor 1504 may be a chip set having such wireless capability. In short, any number of processor 1504 and/or communication chips 1506 can be used. Likewise, any one chip or chip set can have multiple functions integrated therein.

In various implementations, the computing system 1500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 1500 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a plurality of semiconductor devices with each of the semiconductor devices having one or more semiconductor regions extending in a first direction between corresponding source and drain regions, such that the source and/or drain regions of neighboring devices are adjacent to one another along a second direction different from the first direction. The integrated circuit also includes a plurality of conductive contacts with each of the plurality of conductive contacts being over a corresponding one of the source or drain regions, a first dielectric structure between each adjacent pair of source or drain regions in the second direction, and a plurality of second dielectric structures compositionally distinct from the first dielectric structure, each of the second dielectric structures being between an adjacent pair of conductive contacts and over the first dielectric structure. Each of the second dielectric structures has a substantially same thickness, such that the smallest thickness of the second dielectric structures is within 1 nm of the largest thickness of the second dielectric structures.

Example 2 includes the subject matter of Example 1, wherein the one or more semiconductor regions are fins that comprise silicon.

Example 3 includes the subject matter of Example 1, wherein the one or more semiconductor regions comprise a plurality of semiconductor nanoribbons.

Example 4 includes the subject matter of Example 3, wherein the plurality of semiconductor nanoribbons comprise germanium, silicon, or a combination thereof.

Example 5 includes the subject matter of any one of Examples 1-4, wherein the second dielectric structures comprise silicon and nitrogen.

Example 6 includes the subject matter of Example 5, wherein the first dielectric structure comprises silicon and oxygen.

Example 7 includes the subject matter of any one of Examples 1-6, wherein at least one of the second dielectric structures has a length along the second direction that is greater than a length along the second direction of another one of the second dielectric structures.

Example 8 includes the subject matter of any one of Examples 1-7, wherein the smallest thickness of the second dielectric structures is within 0.5 nm of the largest thickness of the second dielectric structures.

Example 9 is a printed circuit board comprising the integrated circuit of any one of Examples 1-8.

Example 10 is an electronic device that includes a chip package having one or more dies. At least one of the one or more dies includes a plurality of semiconductor devices, with each of the semiconductor devices having one or more semiconductor regions extending in a first direction between corresponding source or drain regions, such that the source or drain regions are adjacent to one another along a second direction different from the first direction. The at least one of the one or more dies also includes a plurality of conductive contacts with each of the plurality of conductive contacts being over a corresponding one of the source or drain regions, a dielectric fill between each adjacent pair of source or drain regions in the second direction, and a plurality of masking structures. Each of the plurality of masking structures is between an adjacent pair of conductive contacts and over the dielectric fill and each of the plurality of masking structures has a substantially same thickness.

Example 11 includes the subject matter of Example 10, wherein the one or more semiconductor regions are fins that comprise silicon.

Example 12 includes the subject matter of Example 10, wherein the one or more semiconductor regions comprise a plurality of semiconductor nanoribbons.

Example 13 includes the subject matter of Example 12, wherein the plurality of semiconductor nanoribbons comprise germanium, silicon, or a combination thereof.

Example 14 includes the subject matter of any one of Examples 10-13, wherein the plurality of masking structures comprise silicon and nitrogen.

Example 15 includes the subject matter of any one of Examples 10-14, wherein the dielectric fill comprises silicon and oxygen.

Example 16 includes the subject matter of any one of Examples 10-15, wherein at least one of the plurality of masking structures has a length along the second direction that is greater than a length along the second direction of another one of the plurality of masking structures.

Example 17 includes the subject matter of any one of Examples 10-16, further comprising a printed circuit board, wherein the chip package is attached to the printed circuit board.

Example 18 is a method of forming an integrated circuit. The method includes forming a plurality of fins comprising semiconductor material, wherein the plurality of fins extend parallel to one another in a first direction; forming a plurality of source or drain regions at ends of the semiconductor material of adjacent ones of the plurality of fins, such that the plurality of source or drain regions are adjacent to one another along a second direction different from the first direction; forming a first dielectric structure around and over the plurality of source or drain regions; recessing the first dielectric structure, wherein the recessed first dielectric structure does not expose a top surface of any of the plurality of source or drain regions; forming a sacrificial material within a recessed area above the first dielectric structure; etching away portions of the sacrificial material between adjacent ones of the plurality of source or drain regions; forming second dielectric structures within the etched-away portions of the sacrificial material; removing the sacrificial material; etching portions of the first dielectric structure around the plurality of source or drain regions and between the second dielectric structures; and forming conductive contacts on the plurality of source or drain regions and between the second dielectric structures.

Example 19 includes the subject matter of Example 18, wherein forming the second dielectric structures comprises forming a first structure having a first length along the second direction and forming a second structure having a second length along the second direction that is greater than the first length.

Example 20 includes the subject matter of Example 19, wherein each of the first structure and the second structure is formed to have a substantially same thickness.

Example 21 includes the subject matter of any one of Examples 18-20, wherein forming the plurality of source or drain regions comprises epitaxially growing the plurality of source or drain regions.

Example 22 includes the subject matter of any one of Examples 18-21, wherein forming the second dielectric structures comprises forming second dielectric structures that include silicon and nitrogen.

Example 23 is an integrated circuit that includes a first semiconductor device having a first semiconductor body extending in a first direction from a first source or drain region, a second semiconductor device having a second semiconductor body extending in the first direction from a second source or drain region, and a third semiconductor device having a third semiconductor body extending in the first direction from a third source or drain region. The first, second, and third source or drain regions are adjacent to one another along a second direction different from the first direction. The integrated circuit also includes a first dielectric structure between each adjacent pair of source or drain regions in the second direction, a second dielectric structure between the first source or drain region and the second source or drain region and over the first dielectric structure, and a third dielectric structure between the second source or drain region and the third source or drain region and over the first dielectric structure. The second dielectric structure has a first length in the second direction and the third dielectric structure has a second length in the second direction different from the first length. The second dielectric structure and the third dielectric structure have a substantially same thickness.

Example 24 includes the subject matter of Example 23, wherein the first, second, and third semiconductor bodies are fins that comprise silicon.

Example 25 includes the subject matter of Example 23, wherein the first, second, and third semiconductor bodies comprise a plurality of semiconductor nanoribbons.

Example 26 includes the subject matter of Example 25, wherein the plurality of semiconductor nanoribbons comprise germanium, silicon, or a combination thereof.

Example 27 includes the subject matter of any one of Examples 23-26, wherein the second dielectric structure and the third dielectric structure comprise silicon and nitrogen.

Example 28 includes the subject matter of Example 27, wherein the first dielectric structure comprises silicon and oxygen.

Example 29 includes the subject matter of any one of Examples 23-28, further comprising first, second, and third conductive contacts, each being over a corresponding one of the first, second, or third source or drain region.

Example 30 includes the subject matter of Example 29, wherein the first, second, and third conductive contacts wrap around at least a portion of each of the first, second, or third source or drain regions.

Example 31 is a printed circuit board comprising the integrated circuit of any one of Examples 23-30.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:
    a plurality of semiconductor devices, each of the semiconductor devices having one or more semiconductor regions extending in a first direction between corresponding source and drain regions, such that the source and/or drain regions of neighboring devices are adjacent to one another along a second direction different from the first direction;
    a first dielectric structure between each adjacent pair of source or drain regions in the second direction;
    a plurality of second dielectric structures compositionally distinct from the first dielectric structure, each of the second dielectric structures being over the first dielectric structure, wherein each of the second dielectric structures has a substantially same thickness, such that the smallest thickness of the second dielectric structures is within 1 nm of the largest thickness of the second dielectric structures; and
    a plurality of conductive contacts, each of the plurality of conductive contacts extending between adjacent ones of the plurality of second dielectric structures and extending through a portion of the first dielectric structure to contact a corresponding one of the source or drain regions.

2. The integrated circuit of claim 1, wherein the one or more semiconductor regions comprise a plurality of semiconductor nanoribbons.

3. The integrated circuit of claim 1, wherein the second dielectric structures comprise silicon and nitrogen.

4. The integrated circuit of claim 3, wherein the first dielectric structure comprises silicon and oxygen.

5. The integrated circuit of claim 1, wherein at least one of the second dielectric structures has a length along the second direction that is greater than a length along the second direction of another one of the second dielectric structures.

6. The integrated circuit of claim 1, wherein the smallest thickness of the second dielectric structures is within 0.5 nm of the largest thickness of the second dielectric structures.

7. A printed circuit board comprising the integrated circuit of claim 1.

8. An electronic device, comprising:
    a chip package comprising one or more dies, at least one of the one or more dies comprising:
        a plurality of semiconductor devices, each of the semiconductor devices having one or more semiconductor regions extending in a first direction between corresponding source or drain regions, such that the source or drain regions are adjacent to one another along a second direction different from the first direction;
        a dielectric fill between each adjacent pair of source or drain regions in the second direction;
        a plurality of masking structures, each of the plurality of masking structures being over the dielectric fill, wherein each of the plurality of masking structures has a substantially same thickness; and
        a plurality of conductive contacts, each of the plurality of conductive contacts extending between adjacent ones of the plurality of masking structures and extending through a portion of the dielectric fill to contact a corresponding one of the source or drain regions.

9. The electronic device of claim 8, wherein the one or more semiconductor regions comprise a plurality of semiconductor nanoribbons.

10. The electronic device of claim 8, wherein the plurality of masking structures comprise silicon and nitrogen.

11. The electronic device of claim 8, wherein the dielectric fill comprises silicon and oxygen.

12. The electronic device of claim 8, wherein at least one of the plurality of masking structures has a length along the second direction that is greater than a length along the second direction of another one of the plurality of masking structures.

13. The electronic device of claim 8, further comprising a printed circuit board, wherein the chip package is attached to the printed circuit board.

14. An integrated circuit comprising:
    a first semiconductor device having a first semiconductor body extending in a first direction from a first source or drain region;
    a second semiconductor device having a second semiconductor body extending in the first direction from a second source or drain region;
    a third semiconductor device having a third semiconductor body extending in the first direction from a third source or drain region, wherein the first, second, and third source or drain regions are adjacent to one another along a second direction different from the first direction;
    a first dielectric structure between each adjacent pair of source or drain regions in the second direction;

a second dielectric structure between the first source or drain region and the second source or drain region and over the first dielectric structure, the second dielectric structure having a first length in the second direction;

a third dielectric structure between the second source or drain region and the third source or drain region and over the first dielectric structure, the third dielectric structure having a second length in the second direction different from the first length, wherein the second dielectric structure and the third dielectric structure have a substantially same thickness; and a conductive contact extending between the second dielectric structure and the third dielectric structure along the second direction and extending through a portion of the first dielectric structure to contact the second source or drain region.

15. The integrated circuit of claim 14, wherein the first, second, and third semiconductor bodies comprise a plurality of semiconductor nanoribbons.

16. The integrated circuit of claim 14, wherein the second dielectric structure and the third dielectric structure comprise silicon and nitrogen.

17. The integrated circuit of claim 16, wherein the first dielectric structure comprises silicon and oxygen.

18. The integrated circuit of claim 14, wherein the conductive contact is a second conductive contact, the integrated circuit further comprising first and third conductive contacts, the first conductive contact extending through a portion of the first dielectric structure to contact the first source or drain region, and the third conductive contact extending through a portion of the first dielectric structure to contact the third source or drain region.

19. The integrated circuit of claim 18, wherein the first, second, and third conductive contacts wrap around at least a portion of each of the first, second, or third source or drain regions.

20. A printed circuit board comprising the integrated circuit of claim 14.

* * * * *